United States Patent
Choi et al.

(10) Patent No.: US 10,910,170 B2
(45) Date of Patent: Feb. 2, 2021

(54) ELECTRONIC DEVICE AND ELECTRONIC DEVICE MANUFACTURING METHOD

(71) Applicant: SAMSUNG ELECTRONICS CO., LTD., Suwon-si (KR)

(72) Inventors: Jong-Min Choi, Seongnam-si (KR); Hyuk-Jae Jang, Seoul (KR); Woong-Chan Kim, Suwon-si (KR); Jung-Tae Kim, Hwaseong-si (KR); Dae-Hyeong Park, Seongnam-si (KR); Sang-Hyun Yi, Suwon-si (KR); Jae-Ryang Lee, Yongin-si (KR); Jeong-Goo Jeon, Suwon-si (KR); Sung-Gun Cho, Hwaseong-si (KR); Sung-Joo Cho, Bucheon-si (KR); Young-Sik Choi, Hwaseong-si (KR); Soon-Woong Yang, Yongin-si Gyeonggi-do (KR); Min-Sung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 119 days.

(21) Appl. No.: 15/765,593

(22) PCT Filed: Aug. 1, 2016

(86) PCT No.: PCT/KR2016/008462
§ 371 (c)(1),
(2) Date: Apr. 3, 2018

(87) PCT Pub. No.: WO2017/065397
PCT Pub. Date: Apr. 20, 2017

(65) Prior Publication Data
US 2019/0080860 A1    Mar. 14, 2019

(30) Foreign Application Priority Data
Oct. 16, 2015   (KR) .................. 10-2015-0144974

(51) Int. Cl.
H01H 13/06        (2006.01)
H01H 13/86        (2006.01)
(Continued)

(52) U.S. Cl.
CPC ............ H01H 13/06 (2013.01); H01H 13/14 (2013.01); H01H 13/86 (2013.01);
(Continued)

(58) Field of Classification Search
CPC ........ H01H 13/06; H01H 13/14; H01H 13/86; H04M 1/18
(Continued)

(56) References Cited

U.S. PATENT DOCUMENTS

| 6,177,408 B1 | 1/2001 | Cozzi et al. |
| 2007/0034493 A1* | 2/2007 | Kawasaki ............ H01H 13/86 200/302.2 |

(Continued)

FOREIGN PATENT DOCUMENTS

| CN | 104854675 | 8/2015 |
| JP | 2006-344528 | 12/2006 |

(Continued)

OTHER PUBLICATIONS

International Search Report for PCT/KR2016/008462 dated Nov. 7, 2016, 3 pages.
(Continued)

*Primary Examiner* — Nguyen Tran
*Assistant Examiner* — Iman Malakooti
(74) *Attorney, Agent, or Firm* — Nixon & Vanderhye, P.C.

(57) ABSTRACT

Various embodiments relating to an electronic device including a key module are disclosed, and according to one embodiment, a portable electronic device comprises: a front
(Continued)

glass cover defining the front surface of the electronic device; a rear cover defining the rear surface of the electronic device; a bezel surrounding a space defined by the front cover and the rear cover, the bezel being integrally formed with or separately formed from the rear cover, the bezel including a portion including an opening; a display device built in the space and including a screen area exposed through the front cover; and a plate including a plane parallel to the front cover within the space, wherein the opening penetrates from the outside of the bezel toward the space in a first direction. The electronic device comprises: a key having a size and a shape that can pass through the opening, the key being movably inserted in the opening and including a first surface facing the first direction; a support structure mounted on the plate or a portion of the bezel and including a hole through which the key passes; a dome button mounted on the support structure and arranged to face the first surface of the key and the hole so that the key can be pressed when moving in the first direction; and a waterproof structure including a flexible material. The waterproof structure may comprise: a first portion located between the first surface of the key and the dome button; and a second portion extending from the first portion and inserted between the support structure and the bezel, the second portion sealing a space between the support structure and the bezel so as to waterproof the space. Other various embodiments are also possible.

12 Claims, 23 Drawing Sheets

(51) Int. Cl.
| | | |
|---|---|---|
| *H04M 1/23* | (2006.01) | |
| *H04M 1/18* | (2006.01) | |
| *H01H 13/14* | (2006.01) | |
| *H04M 1/02* | (2006.01) | |
| *H05K 5/06* | (2006.01) | |
| *H01H 13/48* | (2006.01) | |

(52) U.S. Cl.
CPC ............ *H04M 1/0277* (2013.01); *H04M 1/18* (2013.01); *H04M 1/23* (2013.01); *H04M 1/236* (2013.01); *H05K 5/06* (2013.01); *H01H 13/48* (2013.01); *H01H 2223/002* (2013.01); *H01H 2225/028* (2013.01)

(58) Field of Classification Search
USPC ....................................................... 200/302.2
See application file for complete search history.

(56) References Cited

U.S. PATENT DOCUMENTS

| | | | |
|---|---|---|---|
| 2013/0050919 A1 | 2/2013 | Matsui | |
| 2015/0085443 A1 | 3/2015 | Ito et al. | |
| 2015/0327387 A1 | 11/2015 | Arao | |
| 2016/0217943 A1* | 7/2016 | Kim | ........................ H01H 13/14 |

FOREIGN PATENT DOCUMENTS

| | | |
|---|---|---|
| JP | 2013-045600 | 3/2013 |
| KR | 10-2000-0010992 | 2/2000 |
| KR | 10-2012-0041609 | 5/2012 |
| KR | 10-2014-0075184 | 6/2014 |
| KR | 10-1452970 | 10/2014 |
| KR | 10-2015-0017197 | 2/2015 |
| KR | 10-2015-0026648 | 3/2015 |

OTHER PUBLICATIONS

Written Opinion of the ISA for PCT/KR2016/008462 dated Nov. 7, 2016, 5 pages.
Notification of First Office Action dated Nov. 2, 2018 in counterpart Chinese Patent Application No. CN201680059089.6 and English-language translation of same.
Extended Search Report dated Feb. 13, 2019 in counterpart European Patent Application No. 16855615.7.

* cited by examiner

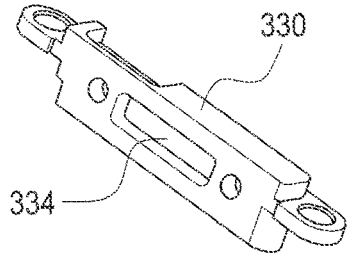
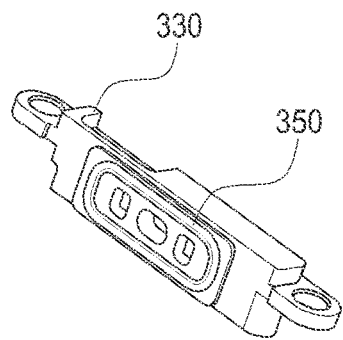
FIG.24A  FIG.24B
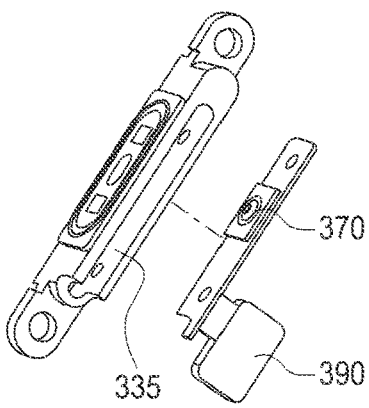
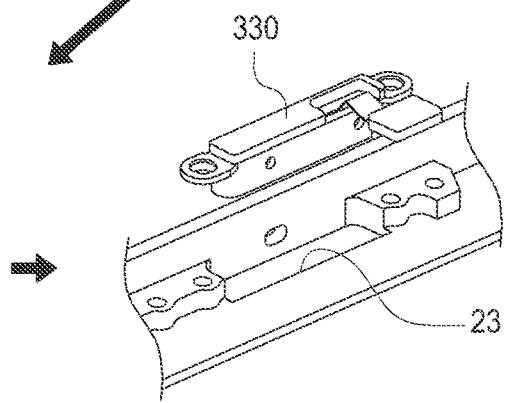
FIG.24C  FIG.24D
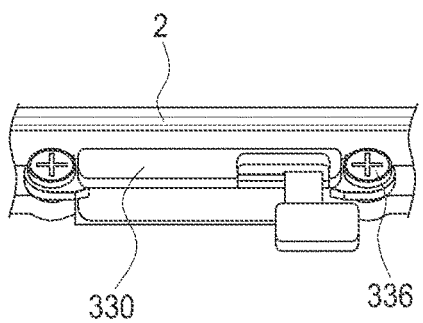
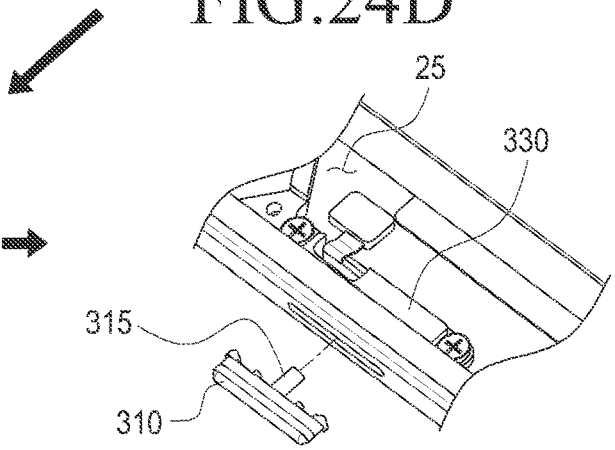
FIG.24E  FIG.24F
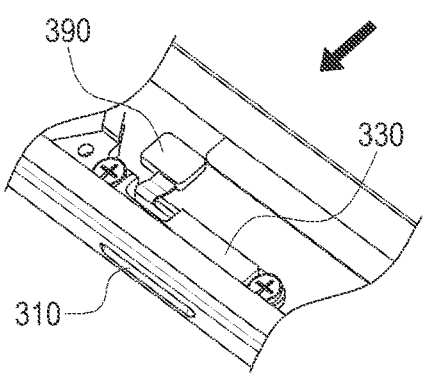
FIG.24G

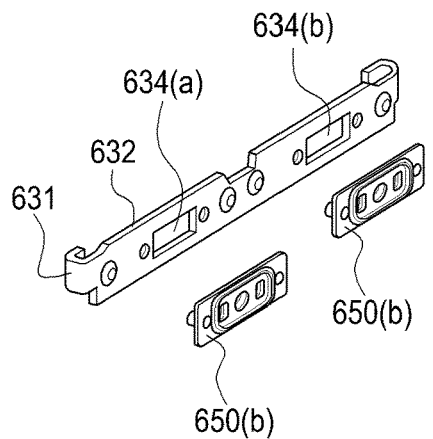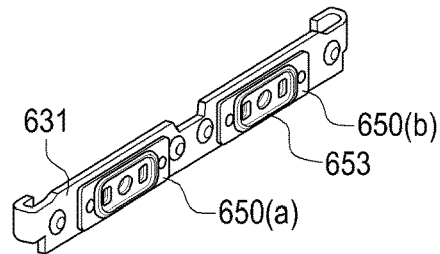
FIG.28A  +  FIG.28B
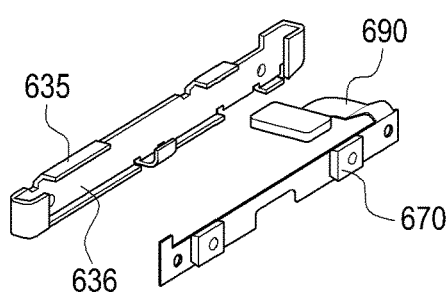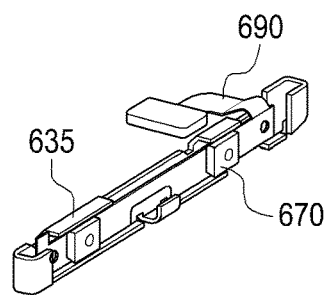
FIG.28C  FIG.28D
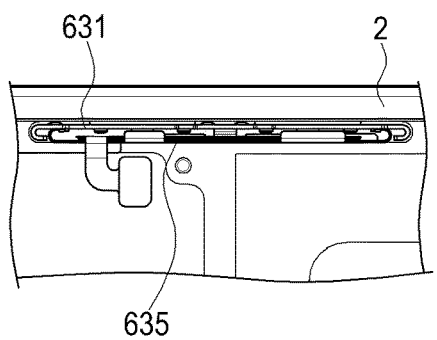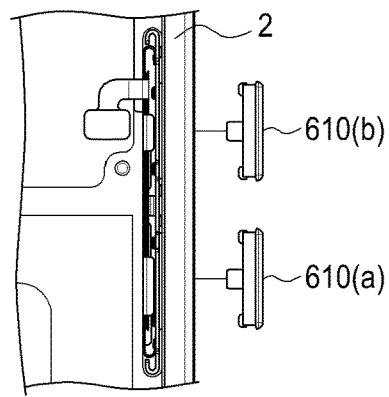
FIG.28E  FIG.28F
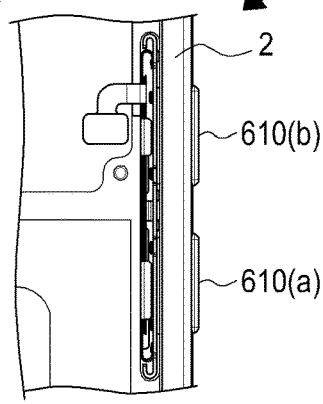
FIG.28G

ELECTRONIC DEVICE AND ELECTRONIC DEVICE MANUFACTURING METHOD

This application is a National Phase Entry of PCT International Application No. PCT/KR2016/008462, which was filed on Aug. 1, 2016 and claims priority under 35 U.S.C. § 119 of Korean Patent Application No. 10-2015-0144974, filed on Oct. 16, 2015, in the Korean Intellectual Property Office and Korean Patent Application No. 10-2016-0020036, filed on Feb. 19, 2016, in the Korean Intellectual Property Office, the disclosure of which is incorporated herein by reference in its entirety.

TECHNICAL FIELD

Various embodiments of the present invention relate to key input devices mounted in portable electronic devices and methods for manufacturing key input devices.

BACKGROUND ART

Portable terminals with new functionalities are quickly developing, and with them flourishing, portable terminals are becoming important part of human everyday life.

Smartphones or other portable terminals which are commonly used as mobile communication technology evolves are equipped with various keys on their front and rear surfaces.

With users' needs for portable terminals being diversified, keys used in portable terminals come with an anti-dust structure to suppress vibrations and a waterproof structure to prevent permeation of a fluid thereinto.

To secure waterproof and anti-dust capability, portable terminal keys are prepared with keys, springs, washers, O-rings, E-rings, and other many parts. In particular, for O ring-based waterproof and anti-dust purposes, additional parts, such as washers to fasten O-rings in position, are a must. However, use of additional parts to secure waterproof capability places a significant limitation on the mounting space of the portable terminal when all of the parts are applied to the terminal and cause problems with key protrusions due to accumulated tolerances. Especially, it is hard to apply all of the parts to such a structure as a side key, where a washer and spring are difficult to mount.

SUMMARY

Embodiments of the present invention provide waterproof capability allowing for utilization of the mounting space in the portable terminal with key modules.

According to the present invention, a portable electronic device may comprise a front glass cover forming a front surface of the electronic device, a rear cover forming a rear surface of the electronic device, a bezel surrounding a space formed between the front cover and the rear cover, formed integrally or separately from the rear cover, and including a portion having an opening, a display device embedded in the space and including a view area exposed through the front cover, and a plate including a flat surface positioned parallel to the front cover in the space, wherein the opening penetrates from an outside of the bezel to the space in a first direction, wherein the electronic device may comprise a key sized and shaped to be able to pass through the opening and including a first surface movably inserted into the opening in the first direction and facing in the first direction, a supporting structure mounted in a portion of the plate or the bezel and including a hole through which the key passes, a dome button mounted in the supporting structure and disposed towards the first surface of the key and the hole to be pressed when the key moves in the first direction, and a waterproof structure including a flexible material, and wherein the waterproof structure may include a first portion positioned between the first surface of the key and the dome button and a second portion extending from the first portion to be inserted between the supporting structure and the bezel and seal to waterproof the space between the supporting structure and the bezel.

According to the present invention, a method for manufacturing a portable electronic device may comprise disposing a waterproof structure having at least one hole in a hole formed in one surface of a supporting structure, disposing a dome button part seated-flexible printed circuit board in an inside receiving space of the supporting structure, seating the waterproof structure and the flexible printed circuit board-disposed supporting structure in a seating part of a bezel, coupling to a main body through a fastening part disposed on a side surface of the supporting structure, and inserting a key having at least one first surface from an outside to an inside of the main body.

According to various embodiments of the present invention, in an electronic device including a key module, washers, O-rings, or other parts may be integrally formed and placed with other components, simplifying the type of product and resolving limitations in the mounting space and hence leading to cost savings and slim products.

According to various embodiments of the present invention, a uni-body key module structure may achieve key waterproof/anti-dust capability with a simplified structure while preventing the side key from wiggling, along with securing a better click feeling.

According to various embodiments of the present invention, a uni-body key module structure enables various design implementations that may meet customers' needs by using the mounting space in the electronic device.

BRIEF DESCRIPTION OF THE DRAWINGS

FIGS. 24A, 24B, 24C, 24D, 24E, 24F, 24G, 25A, 25B, 25C, 25D, 25E, 25F, and 25G are views sequentially illustrating a method for manufacturing a key module provided in an electronic device according to an embodiment of the present invention;

FIGS. 27A, 27B, 27C, 27D, 27E, 27F, 27G, 27H, 28A, 28B, 28C, 28D, 28E, 28F, and 28G are views illustrating a method for manufacturing a key module provided in an electronic device according to an embodiment of the present invention.

DETAILED DESCRIPTION OF EXAMPLE EMBODIMENTS

Figure 1:
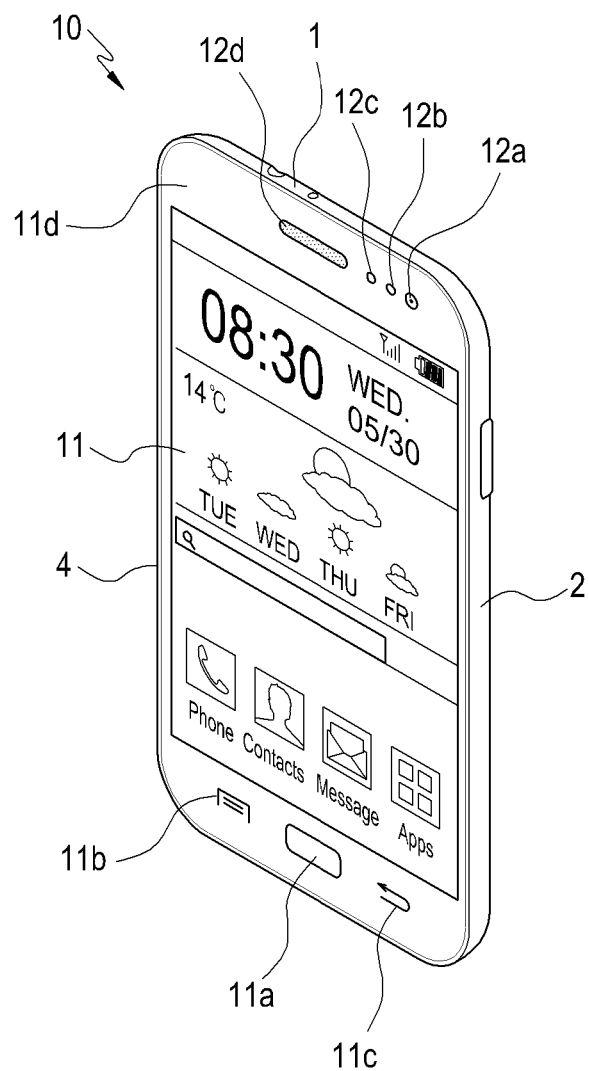
FIG. 1 is a perspective view illustrating a front surface of an electronic device with a key module according to an embodiment of the present invention.

Hereinafter, embodiments of the present disclosure are described with reference to the accompanying drawings. However, it should be appreciated that the present disclosure is not limited to the embodiments, and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and/or order and are used to distinguish a component from another without limiting the components. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

The terms as used herein are provided merely to describe some embodiments thereof, but not to limit the scope of other embodiments. It is to be understood that the singular forms "a," "an," and "the" include plural references unless the context clearly dictates otherwise. The terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a mobile medical device, a camera, or a wearable device. According to various embodiments, the wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit).

According to some embodiments, the electronic device may be a home appliance. Examples of the home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to another embodiment, examples of the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, automatic teller's machines (ATMs), point of sales (POS) devices, or internet of things (IoT) devices (e.g., a bulb, various sensors, an electric or gas meter, a sprinkler, a fire alarm, a thermostat, a street light, a toaster, fitness equipment, a hot water tank, a heater, or a boiler).

According to some embodiments, examples of the electronic device may at least one of part of a piece of furniture or building/structure, an electronic board, an electronic signature receiving device, a projector, or various measurement devices (e.g., devices for measuring water, electricity, gas, or electromagnetic waves). According to various embodiments, the electronic device may be one or a combination of the above-listed devices. According to some embodiments, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments. As used herein, the term "user" may denote a human or another device (e.g., an artificial intelligent electronic device) using the electronic device.

Figure 2:
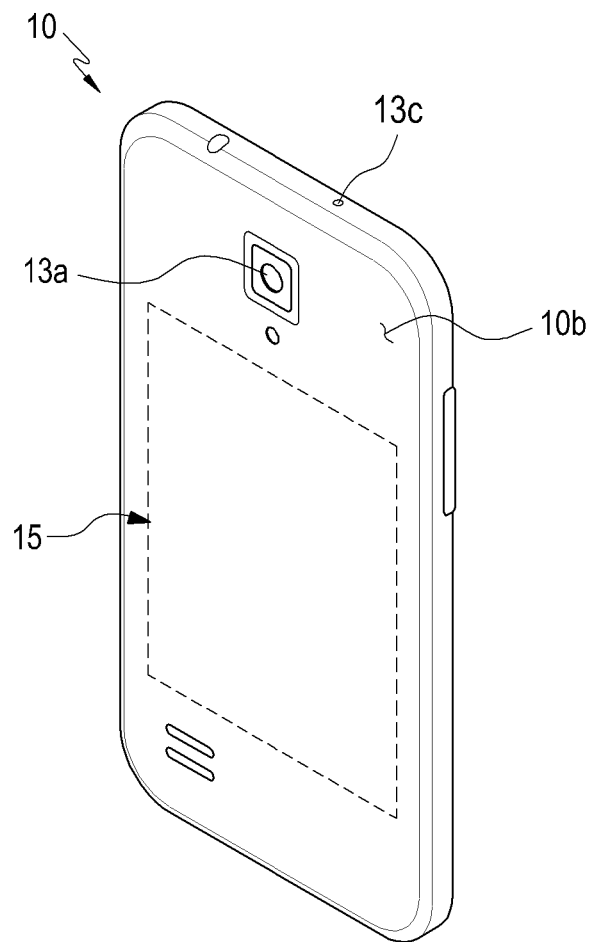
FIG. 2 is a perspective view illustrating a rear surface of an electronic device with a key module according to an embodiment of the present invention.

FIG. 1 is a perspective view illustrating a front surface of an electronic device. FIG. 2 is a perspective view illustrating a rear surface of the electronic device. The electronic device 10 may be a smartphone or a wearable device. Constitutional parts of the electronic device, such as a smartphone, are described with reference to FIGS. 1 and 2.

Referring to FIG. 1, a touch screen 11 may be provided at the center of the front surface of the electronic device 10. The touch screen 11 may occupy most of the front surface of the electronic device 10. FIG. 1 illustrates an example in which a main home screen is displayed on the touch screen 11. The main home screen is a screen that is first to be displayed on the touch screen 11 when the electronic device 10 is powered on. When the electronic device 10 has several pages of different home screens, the main home screen may be the first one of the home screens. The home screen may show up on short-key icons, a main menu shifting key for running applications frequently used, time, and weather. The main menu shifting key may display a menu on the touch screen 11. On the top of the touch screen 11 may be provided a status bar 11d including battery recharge state, signal reception strength, and current time. A home key 11a, a menu button 11b, and a go-back button 11c may be provided on a lower portion of the touch screen 11.

The home key 11a may display the main home screen on the touch screen 11. For example, when the home button 11a is touched while the main home screen and other home screens or menu are in display on the touch screen 11, the main home screen may show up on the touch screen 11. When the home key 11a is touched while applications are running on the touch screen 11, the main home screen may be displayed on the touch screen 11. The home key 11a may be used to display applications recently used or a task manager on the touch screen 11. The menu button 11b may provide a connection menu that may be used on the touch screen 11. The connection menu may include an add widget menu, a change background menu, a search menu, an edit menu, and a setting menu. The go-back button 11c may display the screen displayed immediately before the screen currently in execution or may terminate the latest application used.

According to an embodiment of the present invention, as mentioned above in connection with FIG. 1, a first camera 12a and an illumination sensor 12b or a proximity sensor 12c may be included in an upper area of the front surface of the electronic device 10.

As shown in FIG. 2, a second camera 13a, a flash 13b or a speaker 13c may be included in the rear surface of the electronic device 10. When the electronic device 10 is configured with a detachable battery, a battery cover may form the rear surface of the electronic device 10.

Figure 3:
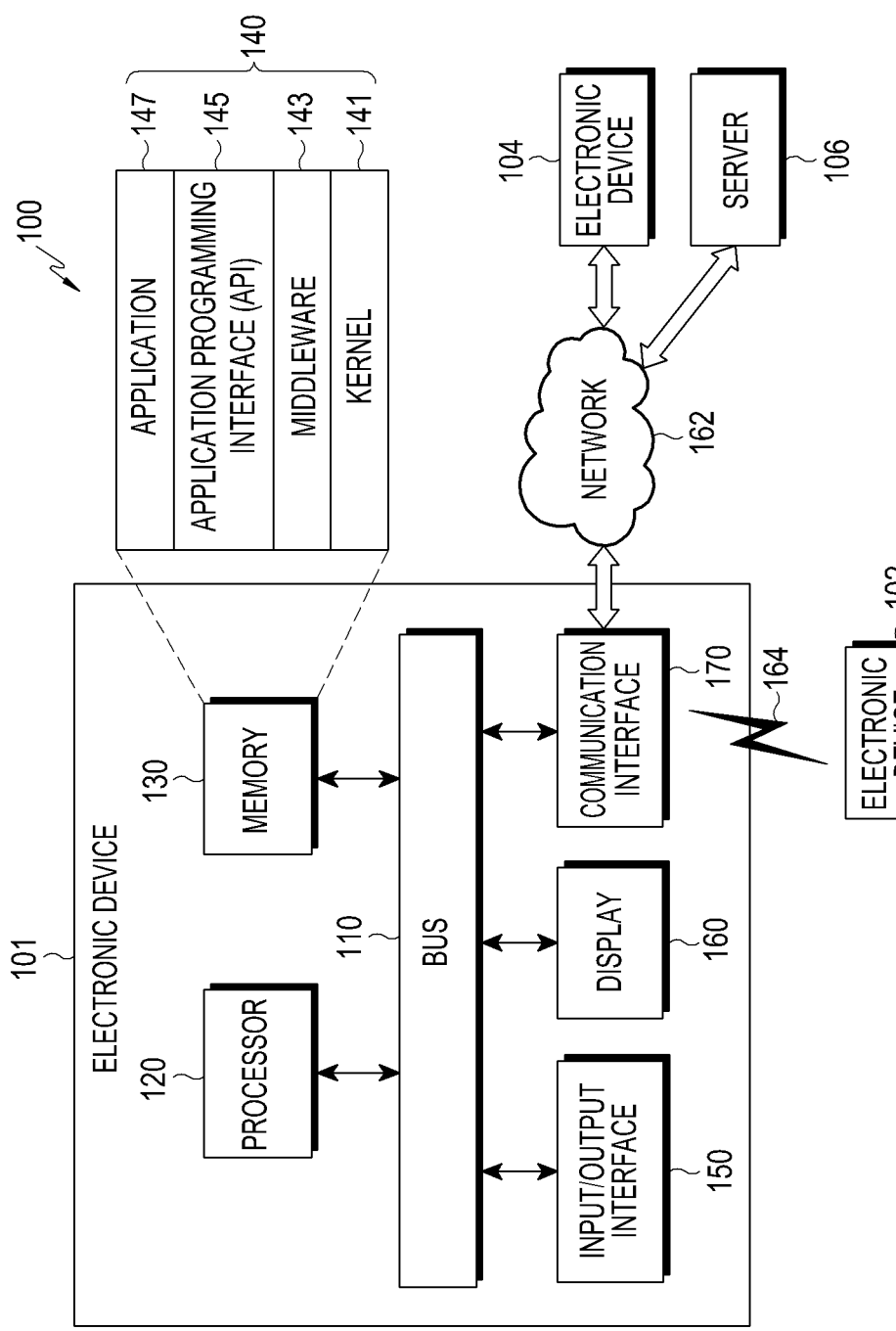
FIG. 3 is a block diagram illustrating a network environment including an electronic device according to an embodiment of the present invention.

Referring to FIG. 3, according to various embodiments, an electronic device 10 is included in a network environment 100. The electronic device 10 may include a bus 110, a processor 120, a memory 130, an input/output interface 150, a display 160, and a communication interface 170. In some embodiments, the electronic device 10 may exclude at least one of the components or may add another component.

The bus 110 may include a circuit for, e.g., connecting the components 110 to 170 with one another and transferring communications (e.g., control messages and/or data) between the components.

The processor 120 may include one or more of a central processing unit (CPU), an application processor (AP), or a communication processor (CP). The processor 120 may perform control on at least one of the other components of the electronic device 10 and/or perform an operation or data processing relating to communication.

The memory 130 may include a volatile and/or non-volatile memory. For example, the memory 130 may store commands or data related to at least one other component of the electronic device 10. According to an embodiment, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS).

For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 10 to control or manage the system resources.

The middleware 143 may function as a relay to allow the API 145 or the application 147 to communicate data with the kernel 141, for example.

Further, the middleware 143 may process one or more task requests received from the application program 147 in order of priority. For example, the middleware 143 may assign at least one of application programs 147 with priority of using system resources (e.g., the bus 110, processor 120, or memory 130) of at least one electronic device 10. For example, the middleware 143 may perform scheduling or load balancing on the one or more task requests by processing the one or more task requests according to the priority assigned to the at least one application program 147.

For example, the API 145 is an interface allowing the application 147 to control functions provided from the kernel 141 or the middleware 143. For example, the API 133 may include at least one interface or function (e.g., a command) for filing control, window control, image processing or text control.

The input/output interface 150 may serve as an interface that may, e.g., transfer commands or data input from a user or other external devices to other component(s) of the electronic device 10. Further, the input/output interface 150 may output commands or data received from other component(s) of the electronic device 10 to the user or the other external device.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user.

For example, the communication interface 170 may set up communication between the electronic device 10 and an external device (e.g., a first electronic device 102, a second electronic device 104, or a server 106). For example, the communication interface 170 may be connected with the network 162 through wireless or wired communication to communicate with the external electronic device (e.g., the second external electronic device 104 or server 106).

The wireless communication may use at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM), as a cellular communication protocol. Further, the wireless communication may include, e.g., short-range communication 164. The short-range communication 164 may include at least one of, e.g., wireless fidelity (Wi-Fi), bluetooth, near-field communication (NFC), or global navigation satellite system (GNSS). The GNSS may include at least one of, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, or plain old telephone service (POTS). The network 162 may include at least one of communication networks, e.g., a computer network (e.g., local area network (LAN) or wide area network (WAN)), Internet, or a telephone network.

The first and second external electronic devices 102 and 104 each may be a device of the same or a different type from the electronic device 10. According to an embodiment, the server 106 may include a group of one or more servers. According to various embodiments, all or some of operations executed on the electronic device 10 may be executed on another or multiple other electronic devices (e.g., the electronic devices 102 and 104 or server 106). According to an embodiment, when the electronic device 10 should perform some function or service automatically or at a request, the electronic device 10, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 10. The electronic device 10 may provide a requested function or service by processing the received result as it is or additionally. To that end, a cloud computing, distributed computing, or client-server computing technique may be used, for example.

The electronic device 10 described below may be any one of the above-mentioned wearable device, laptop computer, net book, smartphone, tablet personal computer (PC), GalaxyTAB™, Ipad™, and wireless charger. In this embodiment, the electronic device may be the smartphone.

According to an embodiment of the present invention, the wireless charger denotes a device that wirelessly transmits and receives power in a short range to charge the electronic device.

Further, the display unit of the electronic device may be rendered to have a minimized bezel area to enlarge the display unit, present a gorgeous design, provide a flexible display unit, or implement a convex or concave display unit.

That is, a surrounding portion of the display unit may be bent allowing the view area to be extended to the bezel and used. As the view area of the display unit is bent to extend up to the bezel, the view area may be used enlarged, or a separate screen in the bezel may be used, a more gorgeous look may be presented in light of design. In other words, the display unit may include a first view area and a second view area provided at both sides of the first view area.

Further, a key module 300 applied to the electronic device 10 may be a data input device which may be formed as a key input device capable of data entry primarily by pressing with a finger, or a touch pad or touchscreen. Basically, a key input device used for data entry is composed of an array of multiple keys. The keys include a send (SND) key which is a key for making a call, a cancel key, a clear (CLR) key, number keys, letter keys, an end (END) key, functional keys, and a power (PWR) key. The key input device also includes a keypad on the front surface of the terminal and multiple side keys that assist in the functions of the keypad and play a role as functional keys.

In this embodiment, although the key module 300 is described taking the side keys disclosed as an example, it is not limited thereto, but various key modules driven for data entry may be applied. In this embodiment, the description here is made based on the key module 300 integrally provided with waterproof functionality.

Further, in this embodiment, a case including a front cover 10a, a rear cover 10b, and a bezel in the electronic device 10 is described as a main body.

According to an embodiment of the present invention, a configuration of the key module 300 provided in the electronic device 10 is described below in detail.

Figure 4:
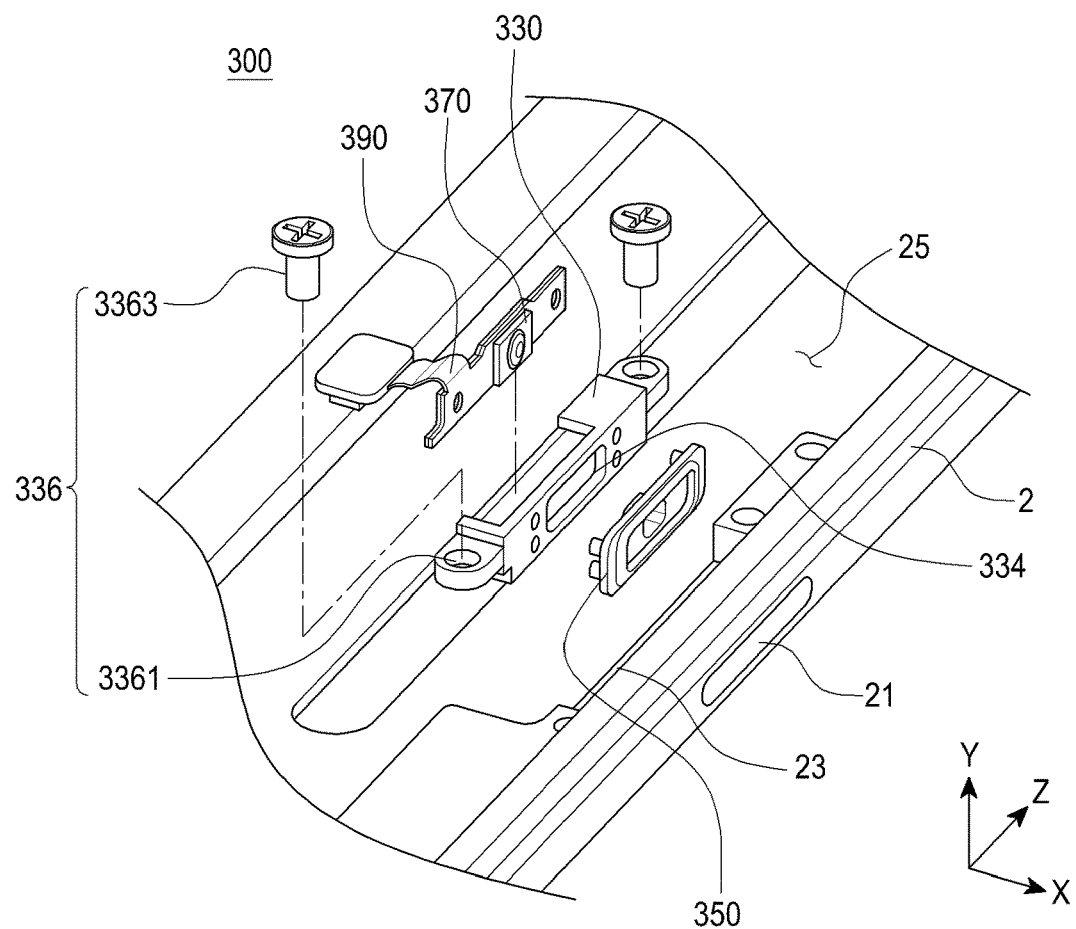
FIG. 4 is an exploded perspective view illustrating a configuration before a key module is combined according to an embodiment of the present invention.
Figure 5:
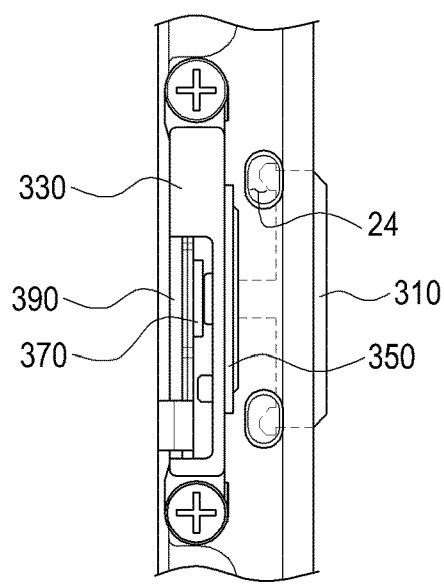
FIG. 5 is a top view illustrating a key module-combined configuration according to an embodiment of the present invention.

FIG. 4 is an exploded perspective view illustrating a configuration before a key module is combined according to an embodiment of the present invention. FIG. 5 is a top view illustrating a key module-combined configuration according to an embodiment of the present invention.

As shown in FIGS. 1 to 5, a portable electronic device (portable terminal) 10 of the present invention may include a front cover 10*a*, a rear cover 10*b*, a bezel 2, a display device 160, and a key module 300.

The front cover 10*a* may form a front surface of the electronic device 10, and the rear cover 10*b* may form a rear surface of the electronic device 10. The bezel 2 may surround at least part of a space 25 formed between the front cover 10*a* and the rear cover 10*b*, and the bezel 2 may include an opening. Various devices arranged in the configuration of the front cover 10*a* and the rear cover 10*b* have been described above, and no detailed description thereof is presented.

The bezel 2 may include an opening 21 for inserting at least part of the key 310 to the inside of the space 25. A portion where a waterproof structure may be seated, i.e., a seating part 23, may be provided in an inside surface where the bezel 2 abuts the space 25. The seating part 23 may have a shape corresponding to where the waterproof structure 350 or a supporting structure 330 is seated, allowing the waterproof structure 350 or supporting structure 330 to be seated and fastened.

Referring back to FIGS. 4 and 5, according to an embodiment of the present invention, the key module 300 may be disposed on a side surface of the portable electronic device 10 and may include the key 310, the supporting structure 330, the waterproof structure 350, a dome button 370, and a flexible printed circuit board 390.

The key module 300 may be disposed on the side surface of the portable electronic device 10 to allow for entry of data information and transfer of electrical signals into the electronic device 10 to obtain a user's desired information.

According to an embodiment of the present invention, key configurations, waterproof structures, and supporting structures of key modules 300, 400, 500, and 600 are described below in detail.

Figure 6:
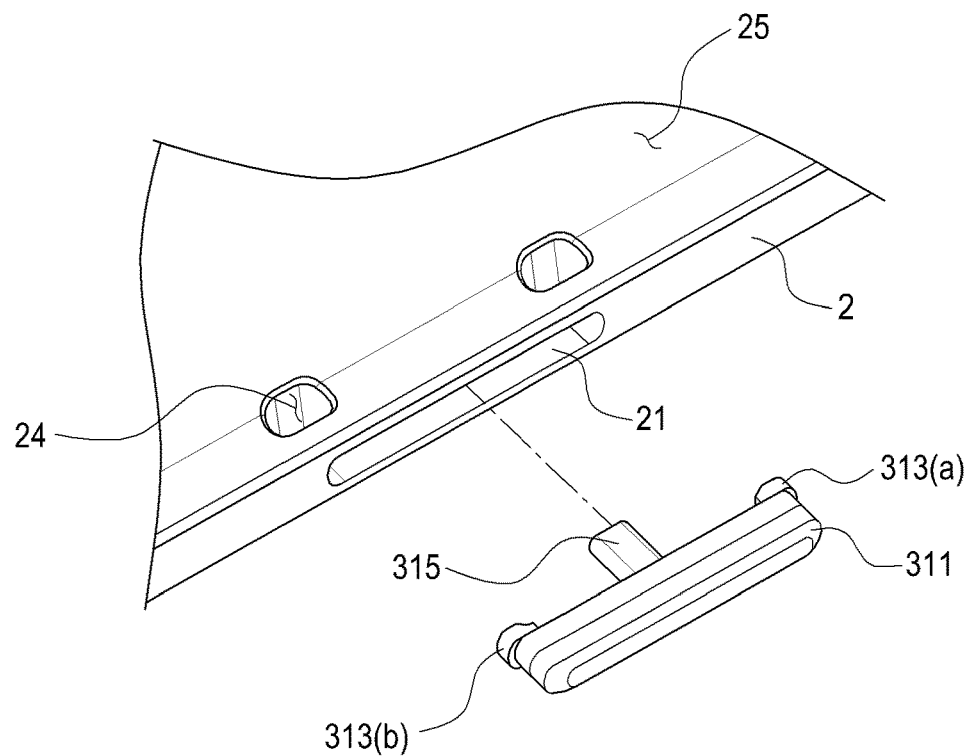
FIG. 6 is a perspective view illustrating a direction in which a key of a key module configuration is combined according to an embodiment of the present invention.

FIG. 6 is a perspective view illustrating a direction in which a key of a key module configuration is combined according to an embodiment of the present invention.

Referring to FIGS. 4 to 6, a key 310 may be positioned to be shaped and sized to be movable in a space 25 between the front cover 10*a* and the rear cover 10*b* through an opening 21 of the bezel 2.

According to an embodiment of the present invention, the key 310 may include a key button 311 disposed on the bezel 2 and a first surface 314 that is connected with the key button 311 and that is movably inserted into the space 25 in a first direction X and faces in the first direction X. Steps 313 may be formed in a portion of the key button 311.

The key button 311 may be disposed on the side surface of the portable electronic device 10, allowing the user to easily click with the portable electronic device 10 in his hand.

The first surface 315 may be positioned perpendicular to the lengthwise direction of the key button 311 and be inserted to the inside of the electronic device 10 while moving along the direction of the insertion, i.e., the first direction X. At least one or more first surfaces 315 may be provided.

According to an embodiment of the present invention, there may be a plurality of first surfaces 315 that include a first surface 315 disposed at the center of the key button 311 and assistant first surfaces (not shown) that are spaced in parallel apart from the first surface 315. The first surface 315 may be disposed at the center of the key button 311 to abut the waterproof structure 350 which is described below, transferring an external pressure directly to the inside of the main body. The assistant first surfaces may be placed at both sides of the first surface 315 with a different length from the first surface 315 and may abut the waterproof structure 350 while preventing the first surface 315 from moving in directions other than the first direction X, aiding the first surface 315.

The steps 313 may be provided to abut between the key button 311 and the first surface 315, including, at least, a plurality of steps 313(*a*) and 313(*b*) on the outer surface, preventing the key 310 from escaping off the inside of the supporting structure 330 or waterproof structure 350. The steps are fastened at both sides of the key 311, preventing the key 310 from moving in other directions than the first direction X and hence wiggling.

According to an embodiment of the present invention, the plurality of steps 313(*a*) and 313(*b*) configured on the outer surface of the key button part 311 may be provided to protrude a predetermined length along the lengthwise direction (second direction Y) of the key button part 311. The protruding steps 313(*a*) and 313(*b*) may be stuck to side coupling parts 24 formed in the bezel 2, preventing the key from escaping off. For example, since the protruding steps 313(*a*) and 313(*b*) are stuck to the side coupling parts 24 to support both sides of the key 310, the key 310 may be prevented from being pushed on either side while popping up on the other side when pressed tilted.

The key button 311, first surface 315, and steps 313 described above may be formed of the same or different materials. Since the key button 311 is partially disposed on the outer surface of the electronic device 10, it may be formed of various materials, such as the same metal or plastic as the outer surface of the electronic device 10. The first surface 315 and the steps 313 may be formed of urethane-containing material, preventing damage to the waterproof structure 350 and the internal contacting surface of the electronic device. When formed of different materials, the key button 311 and the steps 313 may be attached by insert injection or bonding. However, the components of the key 310 are not limited to the material described herein, and may apparently be formed of other various materials.

Figure 7:
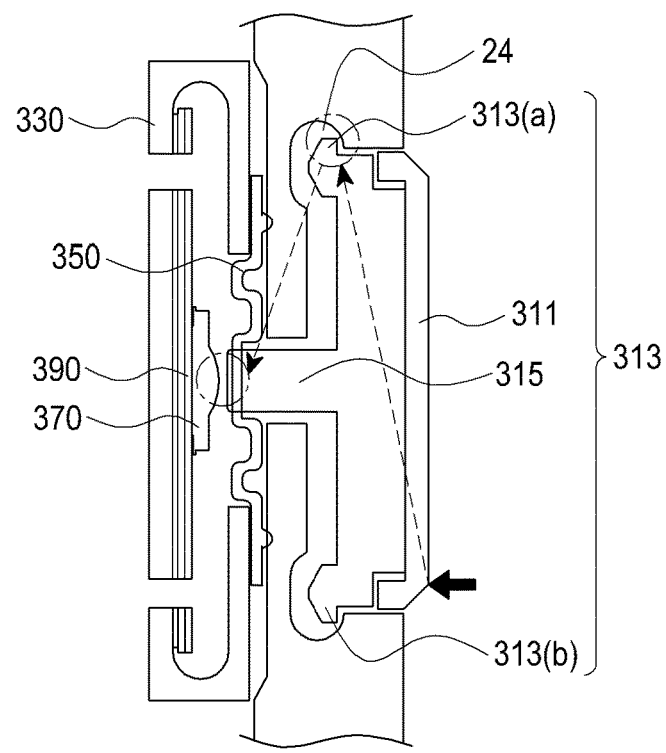
FIG. 7 is a cross-sectional view illustrating a state of a key module being combined for preventing wiggling and providing waterproof capability according to an embodiment of the present invention.

FIG. 7 is a cross-sectional view illustrating a state of a key module being combined for preventing wiggling and providing waterproof capability according to an embodiment of the present invention.

Referring to FIG. 7, according to the present invention, to prevent the key 310 from wiggling, a plurality of steps 313 may be provided at both sides of the key 310. The first step 313(*a*) and the second step 313(*b*) are provided at both sides of the first surface 315 apart from the center of the first surface 315, functioning to prevent the key 310 from escaping off the bezel 2 and carrying pressure applied from the outside to the dome button 580 without loss.

According to the prior art, only one first surface is provided at the center of the key. In this case, where pressure is applied through the center of the key button, although the first surface may deliver the whole pressure to the dome button, it would not if pressed through an edge part away from the center of the key button. For example, if the user presses the edge part of the key button, this may reduce the length at which the first surface is inserted and moved along the first direction, resulting in a failure to loss-free transfer pressure to the dome button. This happens due to the key button moving in such a manner that when the key button is pushed in the main body with one end pressed, the other opposite end comes out, like does a seesaw.

However, according to an embodiment of the present invention, the key 310 is implemented with the first step 313(a) and the second step 313(b) at both sides of the first surface 315 to be projected in the second direction Y and inserted into the side coupling parts 24. The fastening of the first step 313(a) and the second step 313(b) to the side coupling parts 24 of the main body may prevent the key button part 311 from escaping, a predetermined length or more, off to the outside. That is, referring to FIG. 7, even where pressure (denoted with an arrow) is applied onto an edge, not the center of the key button 511, the length at which the first surface 315 is inserted and moved in the first direction X may be prevented from shortening, allowing for loss-free delivery of the pressure to the dome button 370. Accordingly, although the key button 311 is pressed anywhere therein, the first surface 315 may apply the whole pressure to the dome button 370 without such uneven movement.

According to an embodiment of the present invention, to give waterproof functionality to the key 310, the waterproof structure 350 may be provided which is positioned abutting the first surface 315 of the key 310. The waterproof structure 350 may play a role to hermetically seal the space 25 formed between the front cover 10a and the rear cover 10b from the outside of the electronic device 10.

A first portion 351 of the waterproof structure 350 which is formed of an elastic material, as the key 310 operates, may be stretched in the first direction X, transferring the pressure from the first surface 315 to the dome button 370. The dome button 370 may be provided on the flexible printed circuit board 390. The flexible printed circuit board 390 may convert the pressure from the dome button 370 into an electrical signal.

FIGS. 8 to 11 are cross-sectional views illustrating a relationship in length between a bezel and key of an electronic device according to another embodiment of the present invention.

Referring to FIGS. 8 to 11, the outer surface of the main body may include a curved surface with a convex surface outwards, and at least part of the supporting structure 330 and the key 310 may be disposed inside the convex surface-formed curved surface. According to an embodiment of the present invention, a touchscreen 11 forming the top surface of the main body may cover, up to, a portion of the bezel 2, forming a curved surface in a flexible fashion. A rear case forming the bottom surface of the main body may be configured to cover up to a portion of the side surface while forming a curved surface. This allows for an increased space for the user to transfer operations to the electronic device and monitor and an enhanced feeling of grip along with a better look.

A portion of the bezel 2 being curved may impose a limitation on the size of the key module 300 insertable into the inside of the main body, as compared with the prior art, and put a difficulty in configuring the device.

Figure 8:
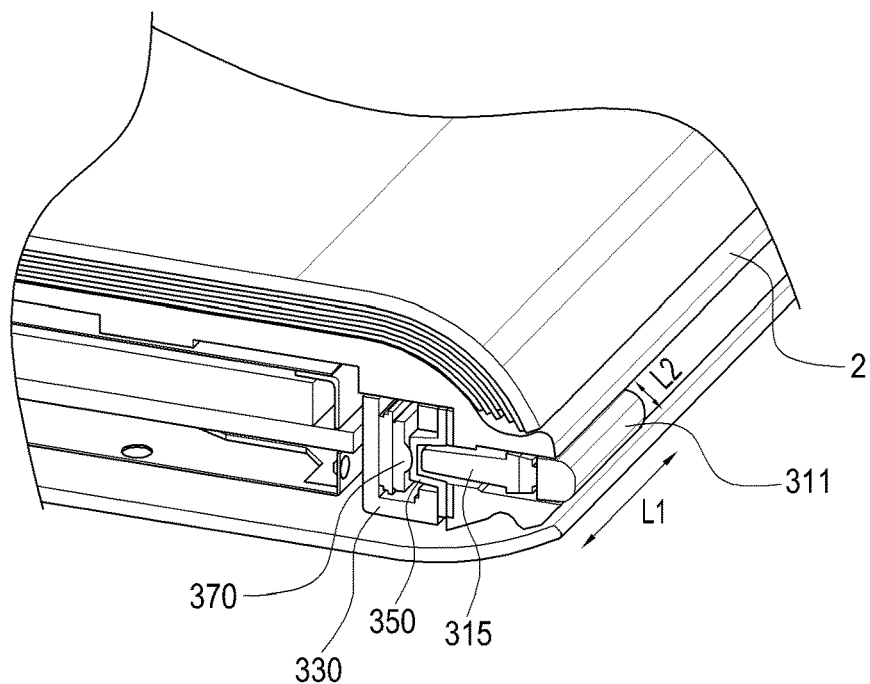
FIGS. 8, 9, 10 and 11 are cross-sectional views illustrating a relationship in length between a bezel and key of an electronic device according to another embodiment of the present invention.

According to an embodiment of the present invention, referring to FIG. 8, the key button 311 disposed in the main body bezel 2 and projecting may be 8 mm to 12 mm long in horizontal length L1 and 0.8 mm to 1.4 mm long in vertical length L2.

Figure 9:
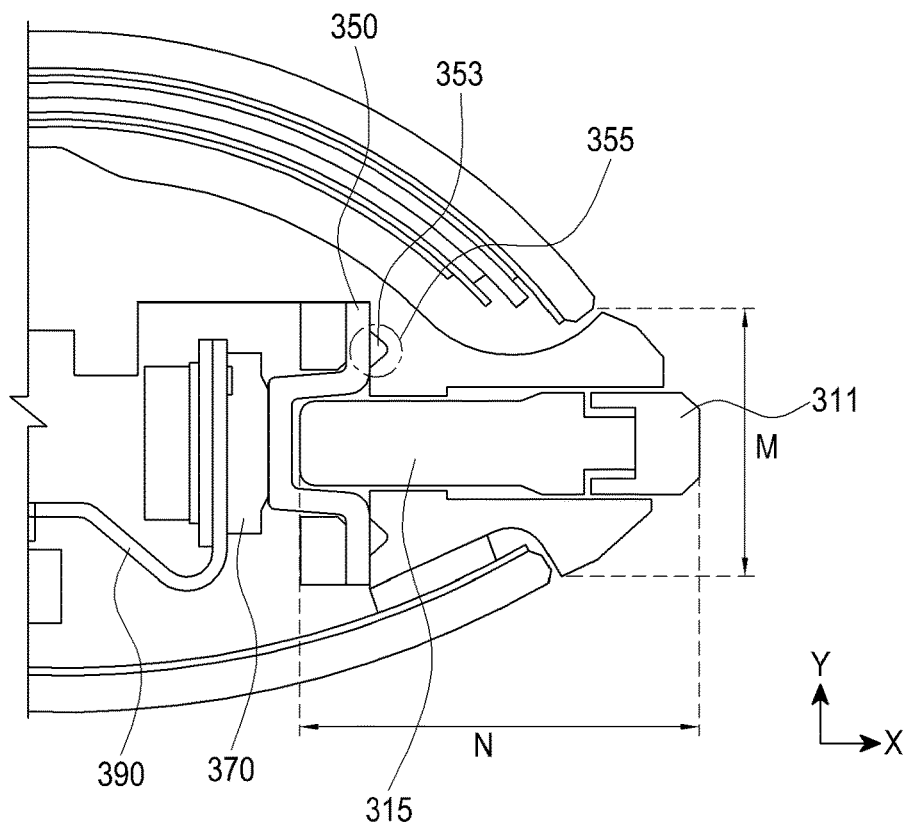
Figure 10:
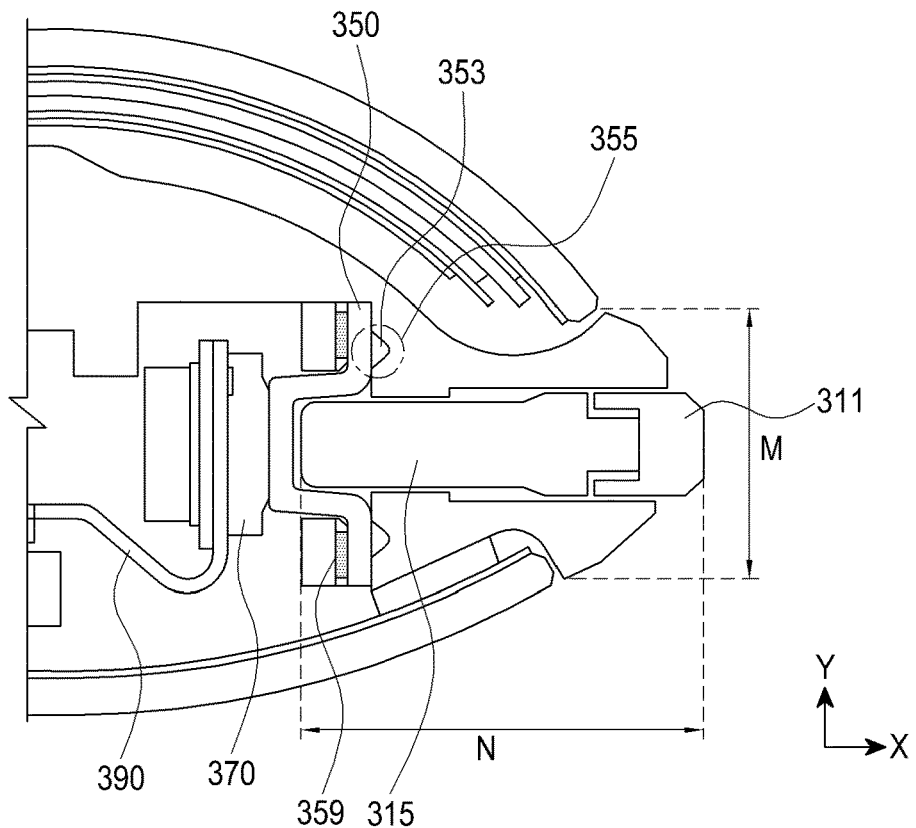
Figure 11:
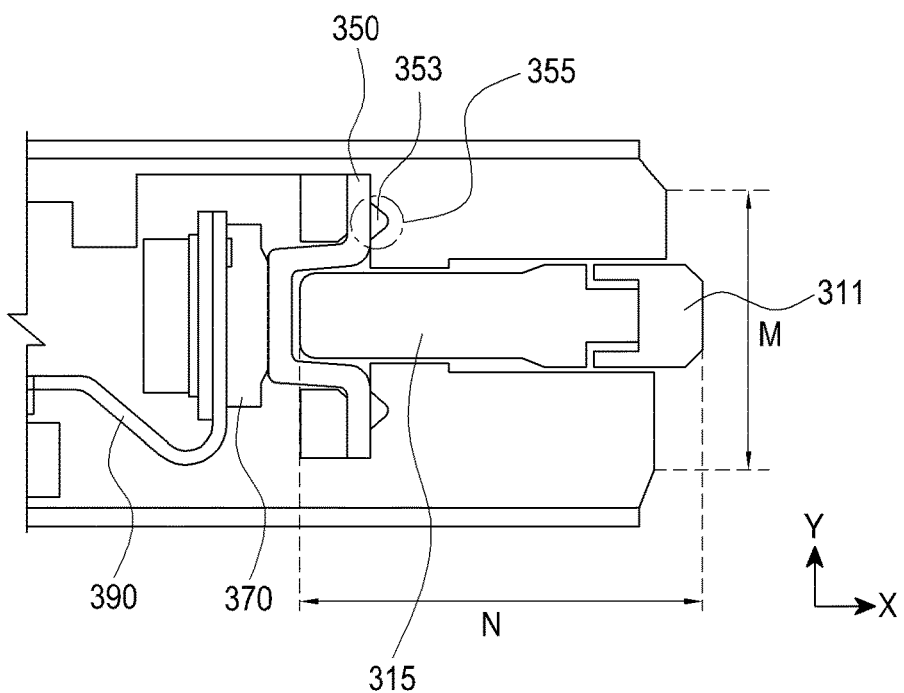

According to an embodiment of the present invention, referring to FIGS. 9 and 10, the key 310 including the first surface 315 may be 3.5 mm to 5.2 mm long in length N along the first direction X.

The distance N towards the inside of the main body, i.e., the first direction X, from the outer surface of the main body to the surface where the inner surface of the main body abuts the supporting structure 330 or waterproof structure 350 may be 3.8 mm or less.

Further, the thickness M of the inner surface or outer surface where the key 310 is inserted in the second direction Y which is perpendicular to the first direction X may be 3.5 mm or less, for example.

According to an embodiment of the present invention, the distance M towards the inside of the main body, i.e., the first direction X, from the outer surface of the main body to the waterproof structure 350 may be 3.2 mm or less.

Further, the bezel facing the curved shape of the front or rear surface of the main body and forming the outer surface may be 2.9 mm or less thick in the second direction Y. Further, the thickness, along the second reception Y, of the bezel that may include the first surface 315 inside the bezel 2 and support the main body may be 2.3 mm or less.

According to an embodiment of the present invention, the mounting space where the key module 300 may be provided in the bezel 2 may be very narrow due to the curved shape of the bezel 2. According to the present invention, the electronic device 10 is implemented so that the key module 300 is positioned as close to the outer surface as possible inside the limited mounting space while providing all of the above-described functions.

However, the numerical limitations are not limited to electronic devices with a curved shape, and may advantageously work for slimmer electronic devices (refer to FIG. 11) than the conventional art.

Further, according to another embodiment, referring to FIG. 10, an adhesive material 359 may be attached onto a surface of the waterproof structure 350 between the bezel 2 and the supporting structure 330. The adhesive material 359 may be placed on the surface of the waterproof structure 350, e.g., the surface positioned opposite the supporting structure 330 and be attached with the supporting structure 330. The adhesive material 359 may include various materials, e.g., an acrylic-based chemical-containing tape or a diversity of adhesives, to attach the waterproof structure 350 or supporting structure 330.

The use of the adhesive material 359 may prevent the waterproof structure 350 from being pushed away that would otherwise occur and enhance the effects of compression of the waterproof structure 350, maximizing waterproof/anti-dust performance.

Figure 12:
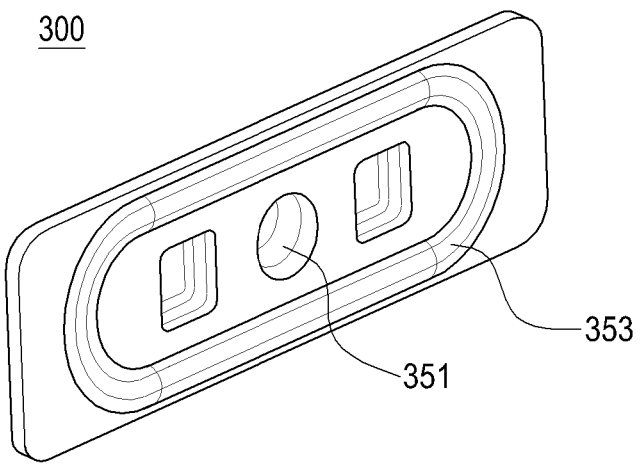
FIG. 12 is a perspective view illustrating a waterproof structure of a key module according to an embodiment of the present invention.
Figures 13A, 13B:
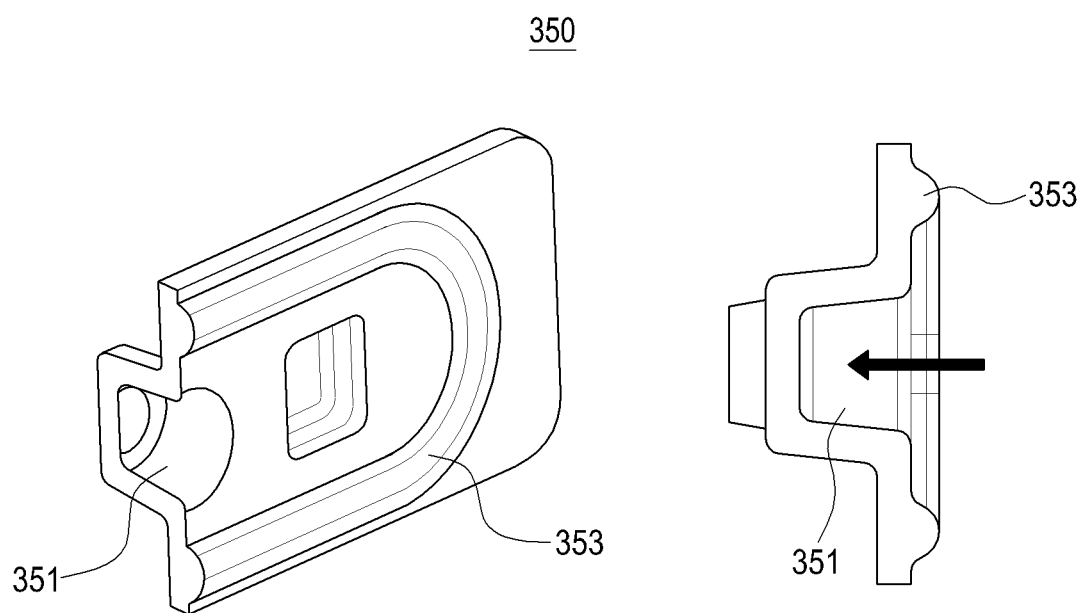
FIGS. 13A, 13B, and 14 are cross-sectional views illustrating an internal structure of a waterproof structure according to an embodiment of the present invention.
Figure 14:
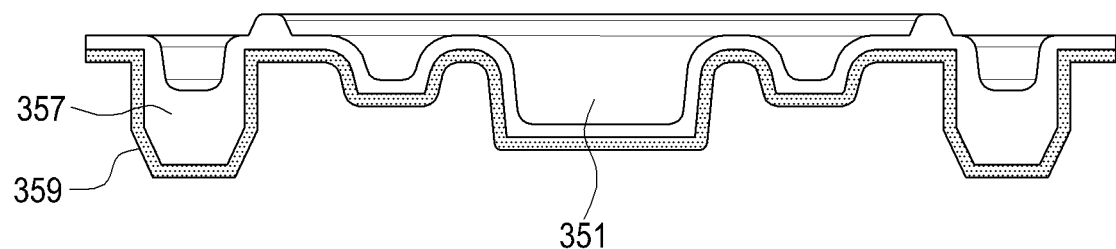

FIG. 12 is a perspective view illustrating a waterproof structure of a key module according to an embodiment of the present invention. FIGS. 13A, 13B, and 14 are cross-sectional views illustrating an internal structure of a waterproof structure according to an embodiment of the present invention.

Figure 15A:
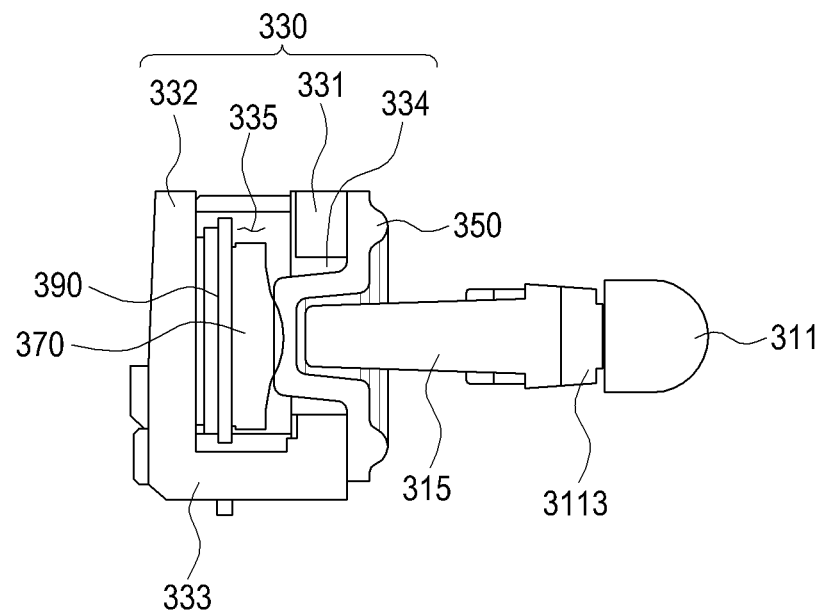
FIGS. 15A and 15B are cross-sectional views illustrating a state of a first surface of a key moving in a first direction according to an embodiment of the present invention.
Figure 15B:
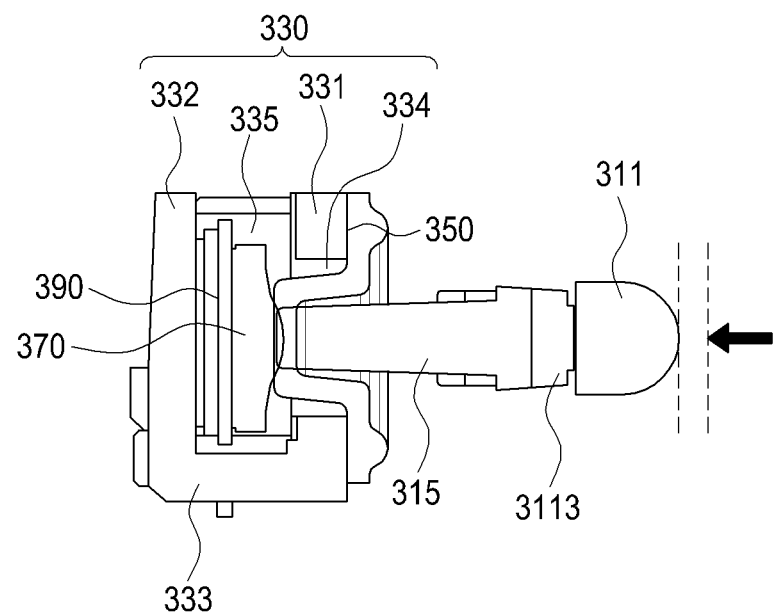

According to an embodiment of the present invention, referring to FIGS. 12, 13A, and 13B, the waterproof structure 350 may be disposed between an inner surface of the bezel 2 and a first face 331 of the supporting structure 330 or between the inner surface of the bezel 2 and a second face 332 of the supporting structure 330 to hermetically seal the space 25 formed between the front cover 10a and the rear cover 10b from the outside of the electronic device 10 (refer to FIGS. 15A and 15B).

Figure 16:
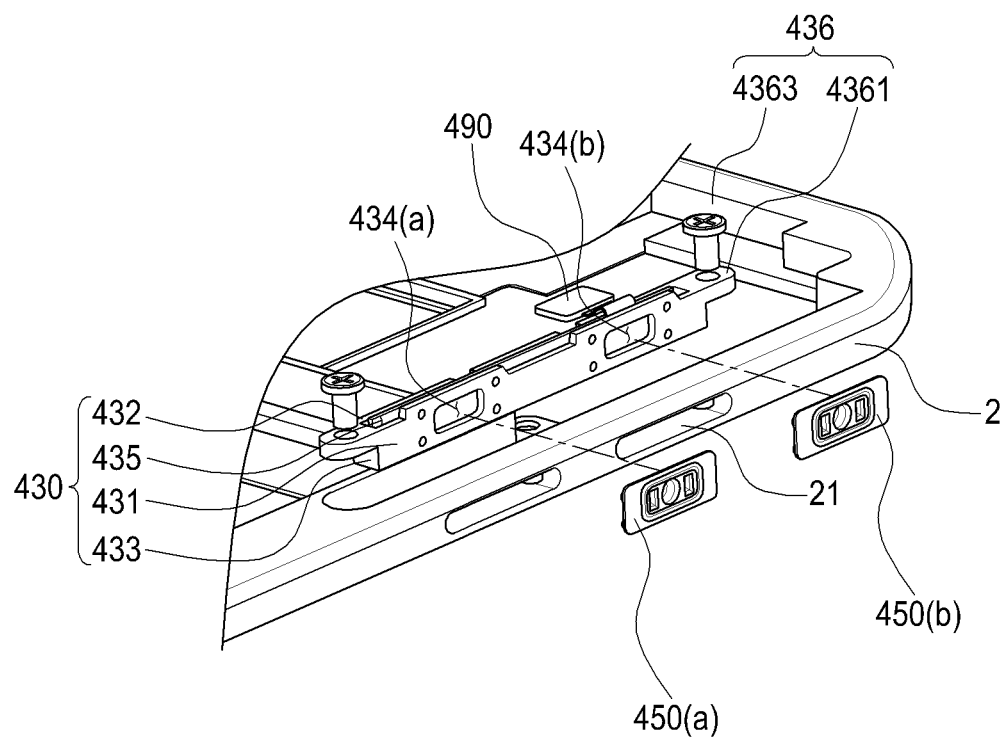
FIGS. 16 and 17 are perspective views illustrating a configuration before a key module is combined and a perspective view illustrating a configuration combined with a key module according to an embodiment of the present invention.

According to another embodiment of the present invention, the waterproof structure 550 may be disposed between an inner surface of the bezel 2 and a first supporting structure 531 or between the inner surface of the bezel 2 and a second supporting structure 535 to hermetically seal the space 25 formed between the front cover 10*a* and the rear cover 10*b* from the outside of the electronic device 10 (refer to FIG. 16).

According to an embodiment of the present invention, the waterproof structure 350 may be inserted and disposed in a hole 334 of the supporting structure 330 and may include a hole-shaped first portion 351 formed to elastically wrap around the first surface 315 of the key 310. The waterproof structure 350 may include a second portion 353 formed to wrap around the first portion 351 and disposed to abut a surface of the bezel 2 to provide waterproof and anti-dust capability.

If the first surface 315 of the key 310 is seated in the first portion 351 and inserted into the inner space 25, the waterproof structure 350 may elastically cover the surroundings of an end of the first surface 315 to shut off permeation of a fluid or other foreign bodies into the inside of the electronic device 10. The waterproof structure 350 may be formed of an elastic material. The first portion 351, when elastically stretched and compressed and thus the key 310 moving, may add or reduce pressure onto the dome button 370. For example, the waterproof structure 350 may be formed of an elastic material, e.g., rubber, waterproof structure sponge, etc.

According to an embodiment of the present invention, referring to FIG. 14, the waterproof structure 350 may be configured by forming a material 357 including silicone on the outer surface of the elastic material, corresponding to the shape of the elastic material, and additionally wrapping a film 359 including urethane around the silicone 357. By the above structure, the waterproof structure 350 may have more durability and waterproof capability. The dual-structure (form and film) formed on the outer surface of the waterproof structure 350 may be produced by dual injection or insert injection.

According to an embodiment of the present invention the first portion 351 of the waterproof structure 350 may be stretched or compressed along the first direction X while elastically wrapping around the first surface 315, and the point where a fluid or other foreign bodies may be shut off may be configured as at least one waterproof contacting surface 355 (refer to FIG. 9).

The waterproof contacting surface 355 may be formed as the second portion 353 projecting in the first direction X where the key 310 moves elastically abuts the inside of the main body. According to an embodiment of the present invention, the first surface 315 may be inserted to the first portion 351 of the waterproof structure 350 seated in the seating part 23 of the bezel 2, and the second portion 353 with a predetermined length, which is formed to surround the first surface 315, may overlap the inner surface of the bezel 2. Accordingly, the waterproof structure 350 compressed may form the waterproof contacting surface 355, cutting off permeation of, e.g., a fluid from the outside.

The second portion 353 forming the waterproof contacting surface 355 may be configured in a closed loop, and there may be provided at least one or more second portions 353. The plurality of second portions 353 may be configured in closed loops inside or outside, or other various shapes with an opening, and may be added in various positions of the waterproof structure 350, forming a second waterproof contacting surface or third waterproof contacting surface, reinforcing the waterproof and anti-dust effects.

FIG. 15 is a cross-sectional view illustrating a state of a first surface of a key moving in a first direction according to an embodiment of the present invention.

Of the key module configuration, the supporting structure 330 is described with reference to FIG. 15.

Referring to FIG. 15, the supporting structure 330 may be positioned adjacent the opening 21 of the bezel 2 in the space 25 formed between the front cover 10*a* and the rear cover 10*b*. Further, the supporting structure 330 may include a hole 334 and a receiving space 335 capable of receiving at least part of the key 310 and a fastening part 336 that may be coupled to the main body (refer to FIGS. 1 and 4).

The supporting structure 330 may include a first face 331 and a second face 332 spaced apart in parallel with each other. A supporting flat surface 333 connects the first face 331 and the second face 332 in the space formed between the front cover 10*a* and the rear cover 10*b*.

The supporting flat surface 333 may support the first face 331 and the second face 332 simultaneously with connecting the first face 331 and the second face 332 to each other. Accordingly, the configuration of the overall supporting structure 330 including the first face 331 and the second face 332 disposed perpendicular to the supporting flat surface 333 and in parallel with each other may be disposed in a "U" shape opened in the first direction and the second direction different from the first direction.

The receiving space 335 may be formed between the first face 331 and the second face 332 to allow the dome button 370 and the flexible printed circuit board 390 to be disposed therein, forming a uni-body bracket structure where the parts may be mounted.

The first face 331 and the second face 332 may provide a pathway along which the first surface 315 moves without contacting the opening 21 (pathway leading to the opening).

According to an embodiment of the present invention, the first face 331 of the supporting structure 330 may be formed with the same length as the second face 332 and may include the hole 334 for receiving at least part of the first surface 315. One surface of the first face 331 may be disposed in contact with the waterproof structure 350 disposed in the seating part 23 of the bezel 2, and the other surface of the first face 331 may form one surface of the receiving space 335.

The second face 332 may be spaced apart in parallel with the first face 331, functioning as a supporting member by which various parts may be mounted and supported. From the surface forming the receiving space 335 of the second face 332 outwards, the flexible printed circuit board 390, the dome button 370, the waterproof structure 350, and an end of the first surface 315 may be stacked one over another. That is, for the end of the first surface 315 to press the dome button 370 while moving in the first direction X, the waterproof structure 350 connected with the dome button 370 and the first surface 315 may be positioned so that they may come in contact with each other.

At least one fastening part 336 may be disposed at both sides of the supporting structure 330 so that the supporting structure 330 may be fastened to the inside of the main body.

According to an embodiment of the present invention, the fastening part 336 may include a fastening hole 3361 that is a wing-shaped hole outside the receiving space 335 of the supporting structure 330 and a screw 3363 passing through the fastening hole 3361 to fasten the main body with the supporting structure 330. According to an embodiment of the present invention, although two fastening holes 3361 and two screws 3363 are configured, they are not limited thereto. Rather, various numbers of fastening holes and screws may be provided in a variety of positions to fasten the supporting structure 330 to the inside of the main body, and such fastening may be achieved in other various manners, e.g., by way of bonding, other than screwing.

FIG. 15A is a cross-sectional view illustrating a state in which the first surface 315 is seated in the first portion 351 of the waterproof structure 350 before the key 310 moves, and FIG. 15B is a cross-sectional view illustrating a state in which the first surface 315 applies pressure to the first portion 351 of the waterproof structure 350 as the key 310 moves along the first direction X.

As the key 310 operates from the position shown in FIG. 15A to the position shown in FIG. 15B, the first portion 351 of the waterproof structure 350 which is formed of an elastic member may be stretched along the first direction X to deliver the pressure from the first surface 315 to the dome button 370.

The flexible printed circuit board 390 and the dome button 370 disposed in the receiving space 335 inside the supporting structure 330 is described below.

Turning back to FIGS. 15A and 15B, the dome button 370 may be disposed between the first face 331 and second face 332 of the supporting structure 330.

The dome button 370 may include an elastic material and may transfer press applied from the outside to the flexible printed circuit board 390. According to an embodiment of the present invention, where the key 310 is pressed from the outside in the first direction X, the first surface 315 may transfer the pressure to the dome button 370 while contacting the dome button 370, and as part of the dome button 370 elastically transforms, it may deliver the pressure to the flexible printed circuit board 390. Where the pressure transferred from the outside disappears, the dome button 370 may recover its original dome shape.

For precise transfer of the pressure applied from the outside, the first portion 351 of the waterproof structure 350 may be aligned with the center of the dome button 370.

The flexible printed circuit board 390 may be disposed outside the dome button 370 in the receiving space 335 between the first face 331 and second face 332 of the supporting structure 330.

Here, the portion disposed outside the dome button may correspond to a portion of the flexible printed circuit board 390 and may be disposed between the dome button 370 and the second face 332 of the supporting structure 330. The other than the portion of the flexible printed circuit board 390 may be disposed on the space 25.

The flexible printed circuit board 390 may convert a pressure transferred from the dome button 370 into an electrical signal, assisting in the user's desired function. According to an embodiment of the present invention, where the key 310 is pressed from the outside in the first direction X, the first surface 315 may transfer the pressure to the dome button 370 while contacting the dome button 370. Thereafter, as the dome button 370 partially transforms in an elastic manner to transfer the pressure to the flexible printed circuit board 390, it may produce an electrical signal corresponding to the pressure and deliver the electrical signal to the electronic device 10.

Figure 17:
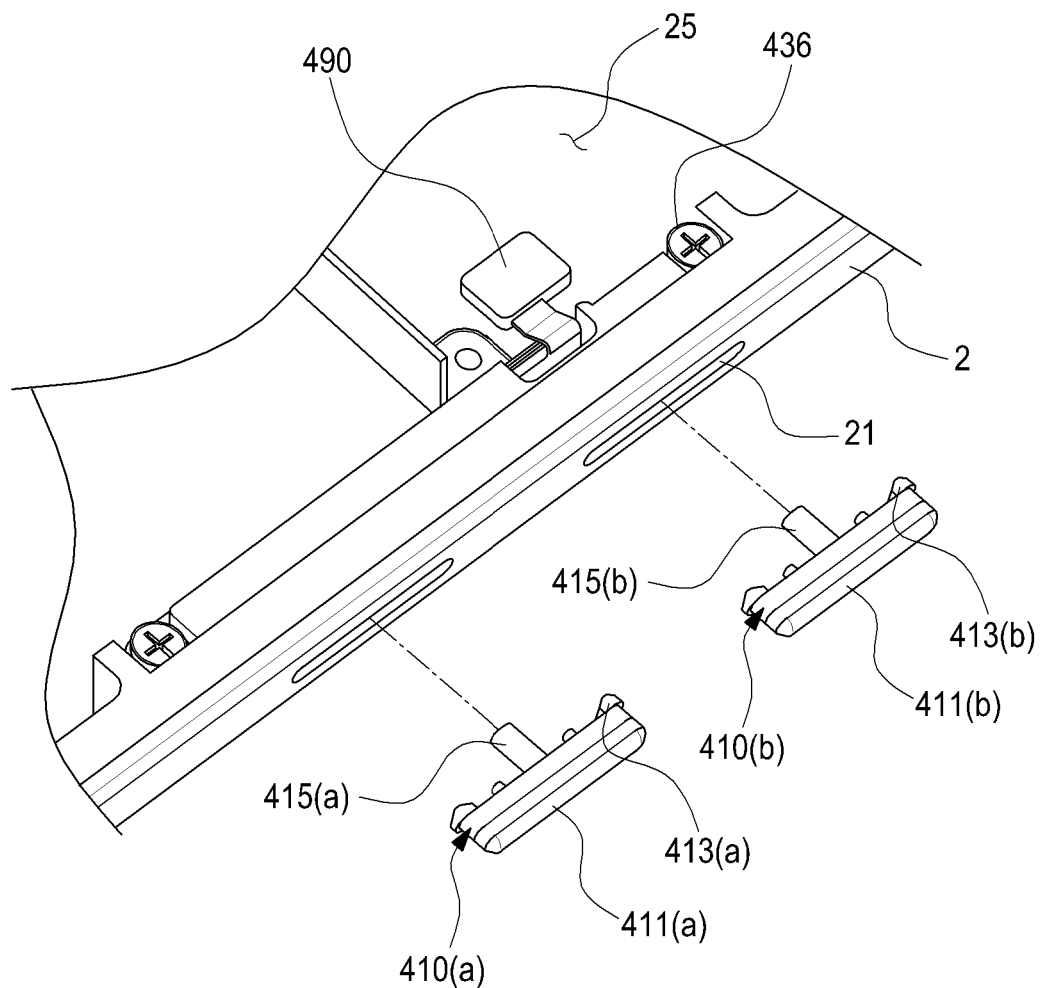

FIGS. 16 and 17 are a perspective view illustrating a configuration before a key module is combined and a perspective view illustrating illustrating a configuration combined with a key module according to an embodiment of the present invention.

Referring to FIGS. 16 and 17, according to another embodiment of the present invention, the key module 400 may be disposed on a side surface of the portable electronic device 10 and may include a first key 410a, a second key 410b, a supporting structure (plate) 430, a first waterproof structure 450a, and a second waterproof structure 450b.

The key module 400 may be disposed on the side surface of the portable electronic device 10 to allow for entry of data information and transfer of electrical signals into the electronic device 10 to obtain a user's desired information.

The instant embodiment represents an example of applying to, e.g., volume keys, operated with two buttons, rather than such a configuration as of a power key which works with a single button of the above-described embodiment.

This differs in that there are provided two keys, two waterproof structures, and two relevant configurations; however, they remain the same in size and shape. Thus, they are described briefly.

A key 410 may be positioned to be shaped and sized to be able to pass through a space 25 between the front cover 10a and the rear cover 10b through an opening 21 of the bezel 2. According to an embodiment of the present invention, the key 410 may include a key button 411 disposed on the bezel 2 and a first surface 314 that is connected with the key button 411 and that may be moved in the space 25 along a first direction X. At least one step 415 may be formed between the key button 411 and the first surface 415.

There may be provided two keys 410 each of which may be inserted into the opening 21. The configuration of each key is the same as what has been described above, and no detailed description thereof is thus given.

The key button 411 may be disposed on the side surface of the portable electronic device 10, allowing the user to easily click with the portable electronic device 10 in his hand.

The first surface 415 may be positioned perpendicular to the lengthwise direction of the key button 411 and be inserted to the inside of the electronic device 10 while moving along the direction of the insertion, i.e., the first direction X. There may be configured two first surfaces 415.

The steps 413 may be provided to abut between the key button 411 and the first surface 415, including, at least, a plurality of steps on the outer surface, preventing the first surface 415 from escaping off the inside of the supporting structure 430 or waterproof structure 450.

The waterproof structure 430 is described below. The supporting structure 430 may be disposed adjacent to two openings 21 of the bezel 2 inside the space 25 formed between the front cover 10a and the rear cover 10b and may include receiving spaces able to at least partially receive the keys 410 and fastening parts 436 that may be fastened to the main body.

The supporting structure 430 may include a first face 431 and a second face 432 spaced apart in parallel with each other. A supporting flat surface 433 may be provided in parallel with the rear cover 10b inside the space formed between the front cover 10a and the rear cover 10b.

The receiving space 435 may be formed between the first face 431 and the second face 432 to allow the dome button 470 and the flexible printed circuit board 490 to be disposed therein, forming a uni-body bracket structure where the parts may be mounted.

The first face 431 and the second face 432 may provide a pathway along which the first surface 415 moves without contacting the opening 2 (pathway leading to the opening).

According to an embodiment of the present invention, the first face 431 may be formed with the same length as the second face 432 and may include a plurality of holes 434(a) and 434(b) for receiving at least part of the first surface 415. That is, the holes 434 in the supporting structure 430 may include a first hole 434(a) and a second hole 434(b) spaced apart from each other. The first hole 434(a) may provide a path along which an end of a first-first surface 415(a) of the first key 410(a) may move, and the second hole 434(b) may provide a path along which an end of a second-first surface 415(b) of the second key 410(b) may move. The key module 400 is configured with keys that are closely tied to each other as are volume keys that let volume up or down. Thus, the interval between the first hole 434(a) and the second hole 434(b) may be set within a range in which the user's finger is permitted to move.

Referring back to FIGS. 16 and 17, the waterproof structure 450 may be disposed between an inner surface of the bezel 2 and the first face 431 or between the inner surface of the bezel 2 and the second face 432 to hermetically seal the space 25 formed between the front cover 10a and the rear cover 10b from the outside of the electronic device 10.

According to an embodiment of the present invention, the waterproof structure 450 may be inserted and disposed in a seating part 23 of the bezel 2 and may include at least one portion first portion 451 formed to elastically wrap around the first surface 415 of the key 410. The waterproof structure 450 may include a second portion 453 formed to wrap around the first portion 451 and disposed to abut a surface of the bezel 2 to provide waterproof and anti-dust capability.

According to an embodiment of the present invention, there may be provided two waterproof structures 450, including a first waterproof structure 450(a) and a second waterproof structure 450(b) in positions corresponding to the interval between the first hole 434(a) and the second hole 434(b).

If the first surface 415(a) of the first key 410(a) and the first surface 415(b) of the second key 410(b) are seated in the respective portions 451(a) and 451(b) of the keys and are inserted into the internal space 25, the waterproof structures 450 may be formed to elastically surround the first surface 415 to prevent permeation of a fluid or other foreign bodies into the inside of the electronic device 10. The waterproof structures 450 may be formed of an elastic material. The first portions 451(a) and 451(b), when elastically stretched and compressed and thus the keys 410 moving, may add or reduce pressure onto the dome buttons 470.

In this embodiment of the present invention, although two keys are provided in one supporting structure, the present invention is not limited thereto. For example, various modifications may be made, e.g., a module having two or more keys inserted therein.

Figure 18:
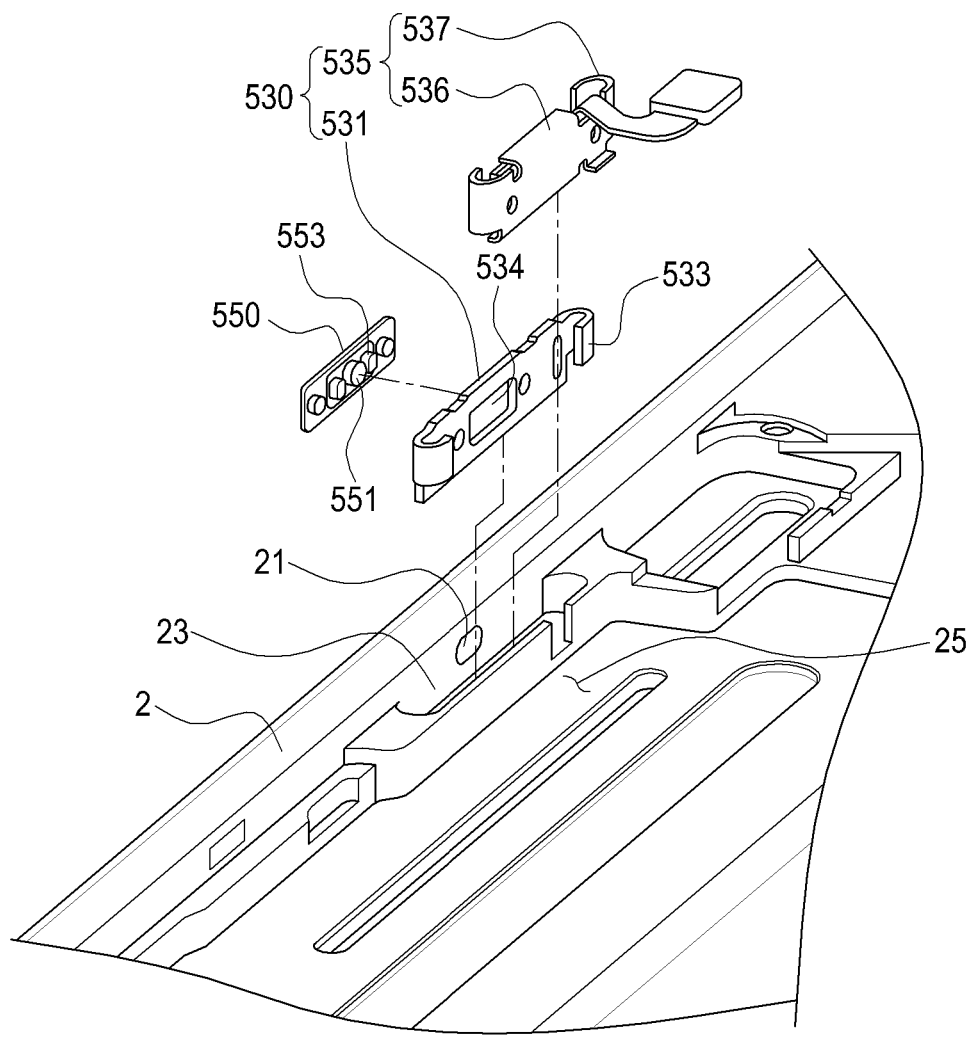
FIGS. 18 and 19 are perspective views illustrating a configuration before a key module is combined and a perspective view illustrating a configuration combined with a key module according to an embodiment of the present invention.
Figure 19:
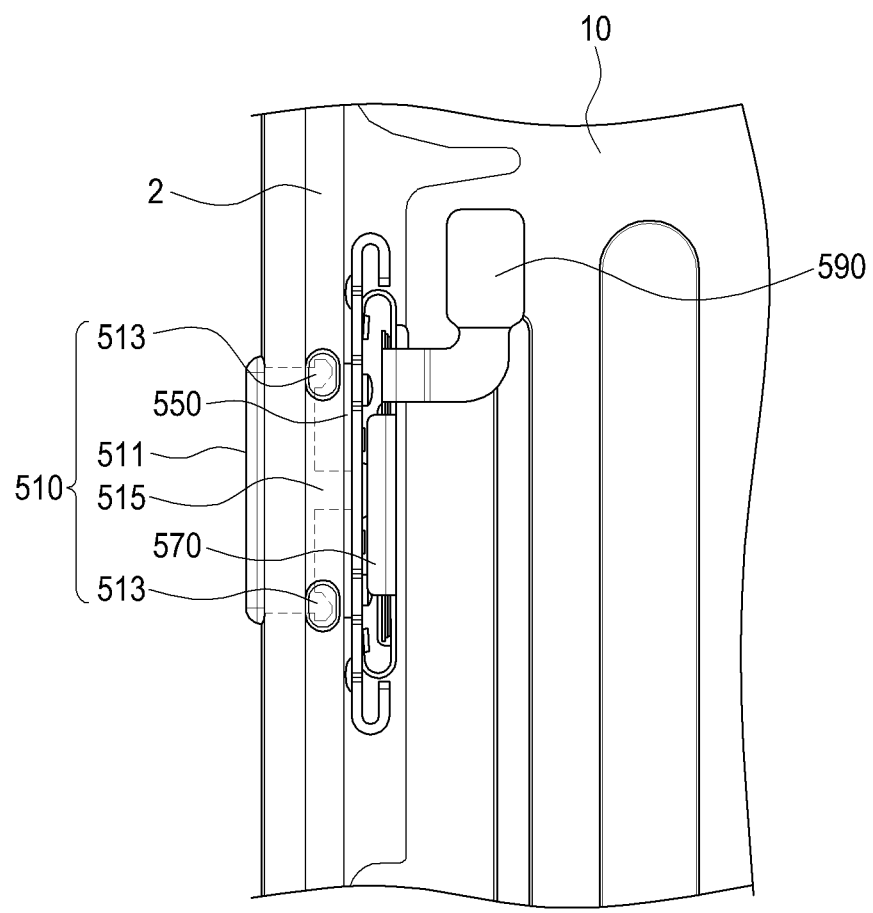

FIGS. 18 and 19 are a perspective view illustrating a configuration before a key module is combined and a perspective view illustrating illustrating a configuration combined with a key module according to an embodiment of the present invention.

Referring to FIGS. 18 and 19, according to another embodiment of the present invention, the key module 500 may be disposed on a side surface of the portable electronic device 10 and may include a key 510, a plurality of supporting structures 530, a waterproof structure 550, a dome button 570, a flexible printed circuit board 590, and a seating part 23.

The key module 500 may be disposed on the side surface of the portable electronic device 10 to allow for entry of data information and transfer of electrical signals into the electronic device 10 to obtain a user's desired information.

The instant embodiment represents an example of applying to, e.g., volume keys, operated with two buttons, rather than such a configuration as of a power key which works with a single button of the above-described embodiment.

The key 510 and the waterproof structure 550 are the same as those described above in connection with the above embodiment and are thus briefly described, with the supporting structures 530 and seating part 23 described detailed.

The key 510 may be positioned to be shaped and sized to be able to pass through a space 25 between the front cover 10a and the rear cover 10b through an opening 21 of the bezel 2. According to an embodiment of the present invention, the key 510 may include a key button 511 disposed on the bezel 2 and a first surface 515 that is connected with the key button 511 and that may be moved in the space 25 along a first direction X. At least one step 515 may be formed between the key button 511 and the first surface 513.

Further, there may be provided two keys 510 each of which may be inserted into the opening 21.

The waterproof structure 550 may be disposed between an inner surface of the bezel 2 and the first supporting structure 531 or between the inner surface of the bezel 2 and the second supporting structure 535 to hermetically seal the space 25 formed between the front cover 10a and the rear cover 10b from the outside of the electronic device 10.

According to an embodiment of the present invention, the waterproof structure 550 may be inserted and disposed in a seating part 23 of the bezel 2 and may include at least one portion first portion 551 formed to elastically wrap around the first surface 515 of the key 510. The waterproof structure 550 may include a second portion 553 formed to surround the periphery of the first portion 551 and disposed to abut a surface of the bezel 2 to provide waterproof and anti-dust capability.

The waterproof structures 550 may be formed of an elastic material. The first portion 551, when elastically stretched and compressed and thus the key 510 moving, may add or reduce pressure onto the dome buttons 570.

Figure 20A:
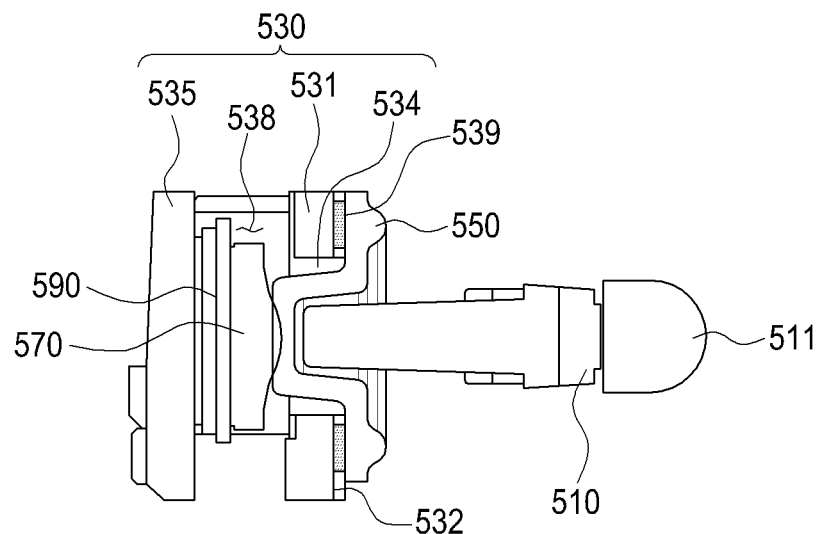
FIGS. 20A and 20B are cross-sectional views illustrating a state of a first surface of a key moving in a first direction according to an embodiment of the present invention.
Figure 20B:
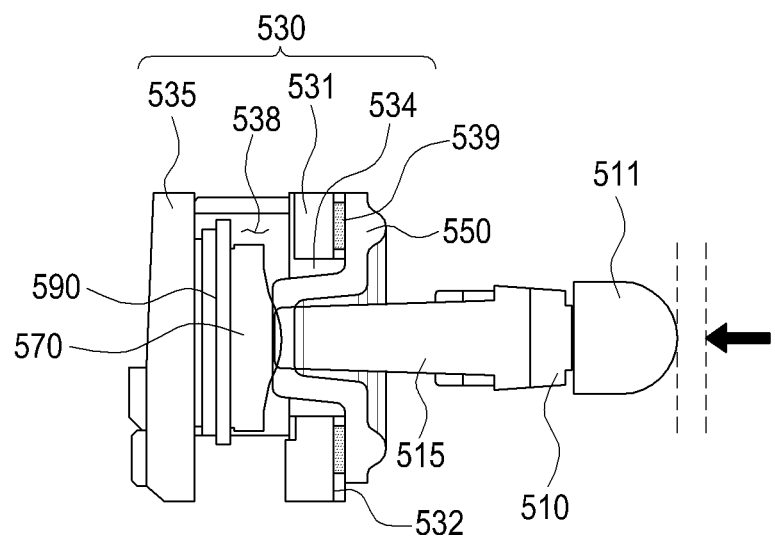

FIGS. 20A and 20B are cross-sectional views illustrating a state of a first surface of a key moving in a first direction according to an embodiment of the present invention.

Of the key module configuration, another supporting structure 530 is described with reference to FIGS. 18, 19, 20A, and 20B.

The supporting structure 530 may be positioned adjacent the opening 21 of the bezel 2 in the space 25 formed between the front cover 10a and the rear cover 10b. For example, the supporting structure 530 may be disposed to be seated in the seating part extending from the bezel 2 and may include a receiving space 538 to be able to receive at least part of the key 510.

The supporting structures 530 may include a first supporting structure 531 and a second supporting structure 535, the first ends of which are brought in tight contact with each other, and the second ends being positioned in parallel with each other.

According to an embodiment of the present invention, the first supporting structure 530 may include a hole 534 for receiving at least part of the first surface 515 of the key 510. One surface of the first supporting structure 531 may include a first supporting surface 532 where the waterproof structure 550 is seated, and the hole 534 may be disposed to be included in the first supporting surface 532. When the waterproof structure 550 is seated on the first supporting surface 532, the hole-shaped first portion 551 of the waterproof structure 550 may be fastened to the hole 534 of the first supporting structure 531.

According to an embodiment of the present invention, an adhesive material 539 may be disposed between the waterproof structure 530 and the first supporting surface 532 to reinforce the fastening. For example, the adhesive material 539 may include a tape or a chemical, such as an adhesive.

According to an embodiment of the present invention, a first protrusion 533 corresponding in shape to the edge of the seating part 23 may be provided at an outside of the first supporting structure 531 to prevent the second supporting structure 535 from escaping off while allowing it to be fastened and seated in the seating part 23.

The first protrusion 533 may be disposed at each of both edges of the first supporting structure 531 and may be provided in a curved shape bent inwards. The first protrusions 533 may be formed with an interval therebetween to form a receiving space 538 while allowing the second supporting structure 535 to be disposed in the space thereinside.

According to an embodiment of the present invention, the second supporting structure 535 may include a second supporting surface 536 capable of receiving and supporting the dome switch 570 and the printed circuit board 590 and at least one second protrusion 537 capable of overall pushing the first supporting structure 531.

The second supporting structure 535 may be disposed at a side of the seating part 25 and may be positioned opposite the first supporting structure 531 disposed at the opposite side of the seating part 25. For example, the first supporting structure 531 and the second supporting structure 535 may be disposed opposite and parallel with each other at the edge of the seating part 25 with an elliptical hole.

The second supporting structure 535 may include a second supporting surface 536 apart in parallel with the first supporting surface 532, and the second supporting surface 536 may allow various parts to be mounted and supported. The flexible printed circuit board 590 may be disposed in contact with the second supporting surface 536, and the dome switch 570 may be disposed in contact with the printed circuit board 590 to sequentially transfer pressure coming from the key.

According to an embodiment of the present invention, the second protrusions 537 may be disposed at both side edges of the second supporting structure 535 and provided in curved shapes bent inwards. The second protrusions 537 may be disposed at the center of the second supporting structure 535 and provided in curved shapes bent inwardly.

The second protrusions 535 may be disposed in tight contact with the first supporting structure 531, providing a force to push the first supporting structure 531 outwards (in the direction where the key 510 is disposed or towards the bezel 2). The pushing force may push the first supporting structure 531 to the side surface of the seating part 23 and compress the waterproof structure 550 disposed between the bezel 2 and the first supporting structure 531. The compressed, elastic waterproof structure 550 may reinforce the effect of preventing permeation of a fluid from the outside.

According to an embodiment of the present invention, the first supporting structure 531 and the second supporting structure 535 spaced apart in parallel with each other may form the receiving space 538. The first supporting structure 531 and the second supporting structure 535 may provide a path along which the first surface 515 moves without contacting the opening 21.

According to an embodiment of the present invention, the first supporting structure 531 may be configured to be relatively larger than the second supporting structure 535, and the second protrusion 537 may be disposed while pushing the first supporting structure 531. According to the present invention, although two second protrusions 537 are disposed at both sides, with one second protrusion under the center in a curved shape, the present invention is not limited thereto, and various shapes and numbers of second protrusions may be provided which are able to form the receiving space 538 while pushing the first supporting structure 531 to compress the waterproof structure 550.

Returning to FIG. 18, the seating part 23 may be configured to extend from the bezel 2 of the electronic device 10, forming the receiving space 538 (refer to FIG. 20) for receiving the supporting structure 530. For example, if the first supporting structure 531 and the second supporting structure 535 form the outer surface of the receiving space 538, the seating part 23 may form a lower portion of the receiving space 538.

According to an embodiment of the present invention, the seating part 23 may be configured of an elliptical hole and have an opening for receiving at least part of the first surface 515 of the key 510. The seating part 23 may be configured of the same material as the bezel 2 and extend therefrom. The supporting structures 530 may be fastened by their mutual tension inside the seating part 23 with a predetermined shape, eliminating the need for producing separate coupling parts and an additional assembling and hence simplifying the process.

For example, different from the above-described embodiment, they may be fastened to the electronic device 10 with the configuration of the seating part 23 shaped corresponding to the outer surface of the supporting structures 530 extending from the bezel 2 and the configuration of the first supporting structure 531 and the second supporting structure 535 mutually fastened in the seating part 23 but without the configuration of the fastening part 336 (refer to FIG. 4). Further, at least one second protrusion 537 of the second supporting structure 535 may push out the first supporting structure 531 to compress the elastic waterproof structure 550 without rolling up externally, thereby increasing the overlapping area of the waterproof structure 550 with the result of maximized waterproof capability.

FIG. 20A is a cross-sectional view illustrating a state in which the first surface 515 is seated in the first portion 551 of the waterproof structure 550 before the key 510 moves, and FIG. 20B is a cross-sectional view illustrating a state in which the first surface 515 applies pressure to the first portion 551 of the waterproof structure 550 as the key 510 moves along the first direction X.

As the key 510 operates from the position shown in FIG. 20A to the position shown in FIG. 20B, the first portion 551 of the waterproof structure 550 which is formed of an elastic member may be stretched along the first direction X to deliver the pressure from the first surface 515 to the dome button 570.

The flexible printed circuit board 590 and the dome button 570 disposed in the receiving space 538 inside the supporting structure 530 is described below.

Referring to FIGS. 20A and 20B, the dome button 570 may be disposed between the first supporting structure 531 and the second supporting structure 535.

The dome button 570 may include an elastic material and may transfer press applied from the outside to the flexible printed circuit board 590. According to an embodiment of the present invention, where the key 510 is pressed from the outside in the first direction X, the first surface 515 may transfer the pressure to the dome button 570 while contacting the dome button 570, and as part of the dome button 370 elastically transforms, it may deliver the pressure to the flexible printed circuit board 590. Where the pressure transferred from the outside disappears, the dome button 570 may recover its original dome shape.

For precise transfer of the pressure applied from the outside, the first portion 551 of the waterproof structure 550 may be aligned with the center of the dome button 570.

The flexible printed circuit board 590 may be disposed outside the dome button 570 disposed on the second supporting surface 536 between the first supporting structure 531 and the second supporting structure 535.

Here, the portion disposed outside the dome button 570 may correspond to a portion of the flexible printed circuit board 590, and the other than the portion of the flexible printed circuit board 590 may be disposed on the space 25.

The flexible printed circuit board 590 may convert a pressure transferred from the dome button 570 into an electrical signal, assisting in the user's desired function. According to an embodiment of the present invention, where the key 510 is pressed from the outside in the first direction X, the first surface 515 may transfer the pressure to the dome button 570 while contacting the dome button 370. Thereafter, as the dome button 570 partially transforms in an elastic manner to transfer the pressure to the flexible printed circuit board 590, it may produce an electrical signal corresponding to the pressure and deliver the electrical signal to the electronic device 10.

Figure 21:
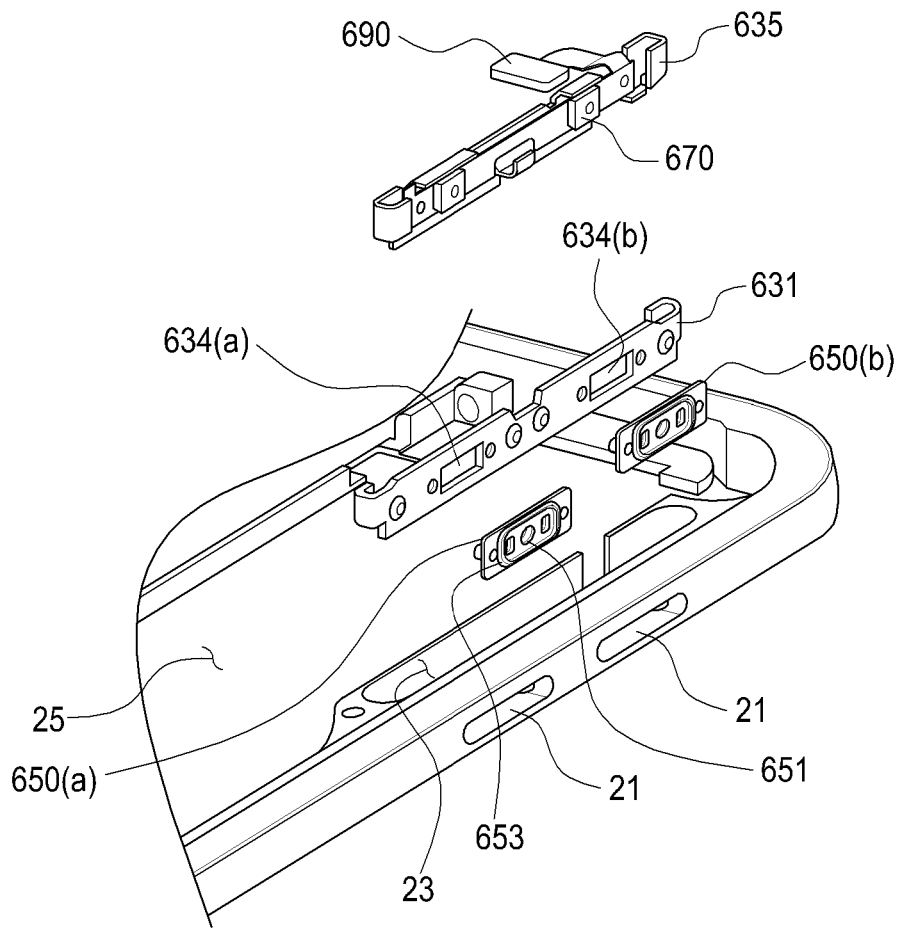
FIGS. 21 and 22 are a perspective view illustrating a configuration before a key module is combined and a perspective view illustrating a configuration combined with a key module according to an embodiment of the present invention.
Figure 22:
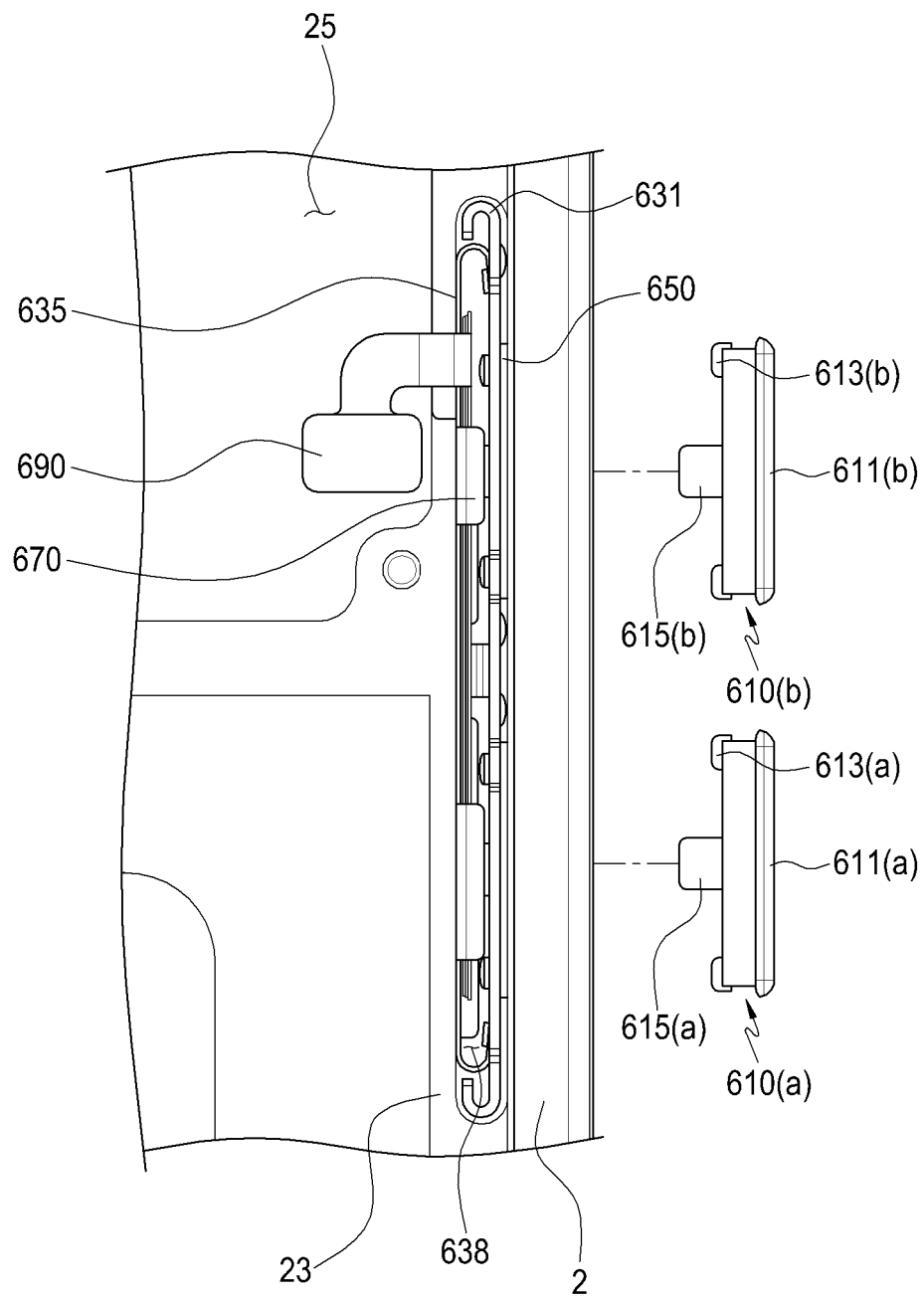

FIGS. 21 and 22 are a perspective view illustrating a configuration before a key module is combined and a perspective view illustrating illustrating a configuration combined with a key module according to an embodiment of the present invention.

Referring to FIGS. 21 and 22, according to another embodiment of the present invention, the key module 600 may be disposed on a side surface of the portable electronic device 10 and may include a first key 610a, a second key 610b, a plurality of supporting structures (plate) 630, a first waterproof structure 650a, and a second waterproof structure 650b.

The key module 600 may be disposed on the side surface of the portable electronic device 10 to allow for entry of data information and transfer of electrical signals into the electronic device 10 to obtain a user's desired information.

The instant embodiment represents an example of applying to, e.g., volume keys, operated with two buttons, rather than such a configuration as of a power key which works with a single button of the above-described embodiment.

This differs in that there are provided two keys, two waterproof structures, and two relevant configurations; however, they remain the same in size and shape. Thus, they are described briefly.

The key 610 may be positioned to be shaped and sized to be able to pass through a space 25 between the front cover 10a and the rear cover 10b through an opening 21 of the bezel 2. According to an embodiment of the present invention, the key 610 may include a key button 611 disposed on the bezel 2 and a first surface 615 that is connected with the key button 611 and that may be moved in the space 25 along a first direction X. At least one step 615 may be formed between the key button 611 and the first surface 615.

There may be provided two keys 610 each of which may be inserted into the opening 21. The configuration of each key is the same as what has been described above, and no detailed description thereof is thus given.

The key button 611 may be disposed on the side surface of the portable electronic device 10, allowing the user to easily click with the portable electronic device 10 in his hand.

The first surface 615 may be positioned perpendicular to the lengthwise direction of the key button 611 and be inserted to the inside of the electronic device 10 while moving along the direction of the insertion, i.e., the first direction X. There may be configured two first surfaces 615.

The steps 613 may be provided to abut between the key button 611 and the first surface 615, including, at least, a plurality of steps on the outer surface, preventing the first surface 615 from escaping off the inside of the supporting structure 630 or waterproof structure 650.

The waterproof structure 630 is described below. The supporting structure 630 may be disposed adjacent to two openings 21 of the bezel 2 inside the space 25 formed between the front cover 10a and the rear cover 10b and may include receiving spaces 638 able to at least partially receive the keys 610 and protrusions that may be strongly fastened to the seating part 23.

The supporting structures 630 may include a first supporting structure 631 and a second supporting structure 635, the first ends of which are brought in tight contact with each other, and the second ends being positioned in parallel with each other.

The receiving space 638 may be formed between the first supporting structure 631 and the second supporting structure 635 to allow the dome button 670 and the flexible printed circuit board 690 to be disposed therein, forming a uni-body bracket structure where the parts may be mounted.

The first supporting structure 631 and the second supporting structure 635 may provide a pathway along which the first surface 415 moves without contacting the opening 2 (pathway leading to the opening).

According to an embodiment of the present invention, the first supporting structure 631 and the second supporting structure 635 may include a plurality of holes 634(a) and 634(b) able to at least partially receive the first surfaces 615(a) and 615(b). That is, the holes 634 in the supporting structure 630 may include a first hole 634(a) and a second hole 634(b) spaced apart from each other. The first hole 634(a) may provide a path along which an end of a first surface 615(a) of the first key 610(a) may move, and the second hole 634(b) may provide a path along which an end of a second surface 615(b) of the second key 610(b) may move. The key module 600 is configured with keys that are closely tied to each other as are volume keys that let volume up or down. Thus, the interval between the first hole 634(a) and the second hole 634(b) may be set within a range in which the user's finger is permitted to move.

Referring back to FIGS. 21 and 22, the waterproof structure 650 may be disposed between an inner surface of the bezel 2 and the first supporting structure 631 or between the inner surface of the bezel 2 and the second supporting structure 635 to hermetically seat the space 25 formed between the front cover 10a and the rear cover 10b from the outside of the electronic device 10.

According to an embodiment of the present invention, the waterproof structure 650 may be inserted and disposed in a seating part 23 of the bezel 2 and may include at least one portion first portion 651 formed to elastically wrap around the first surface 615 of the key 610. The waterproof structure 650 may include a second portion 653 formed to surround the periphery of the first portion 651 and disposed to abut a surface of the bezel 2 to provide waterproof and anti-dust capability.

According to an embodiment of the present invention, there may be provided two waterproof structures 650, including a first waterproof structure 650(a) and a second waterproof structure 650(b) in positions corresponding to the interval between the first hole 634(a) and the second hole 634(b).

If the first surface 615(a) of the first key 610(a) and the first surface 615(b) of the second key 610(b) are seated in the respective portions 651(a) and 651(b) of the keys and are inserted into the internal space 25, the waterproof structures 650 may be formed to elastically surround the first surface 615 to prevent permeation of a fluid or other foreign bodies into the inside of the electronic device 10. The waterproof structures 650 may be formed of an elastic material. The first portions 651(a) and 651(b), when elastically stretched and compressed and thus the keys 610 moving, may add or reduce pressure onto the dome buttons 670.

In this embodiment of the present invention, although two keys are provided in one supporting structure, the present invention is not limited thereto. For example, various modifications may be made, e.g., a module having two or more keys inserted therein.

Now described is a method for manufacturing a key module according to an embodiment of the present invention.

Figure 23:
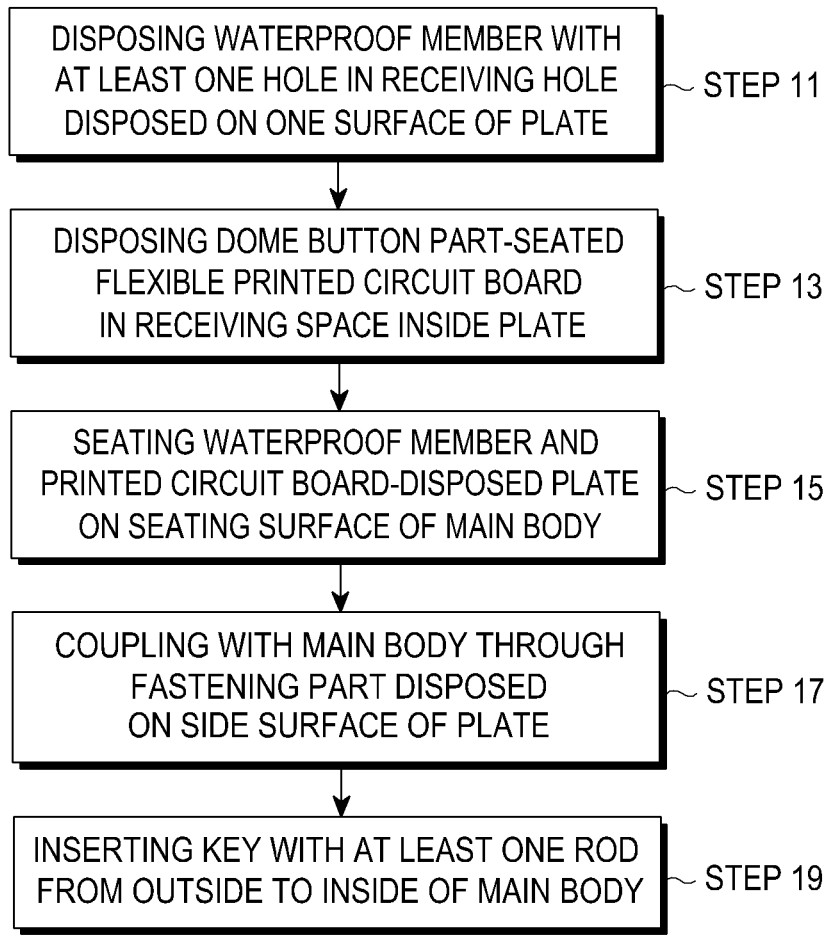
FIG. 23 is a flowchart illustrating a method for manufacturing a key module provided in an electronic device according to an embodiment of the present invention.

FIG. 23 is a flowchart illustrating a method for manufacturing a key module provided in an electronic device according to an embodiment of the present invention.

FIGS. 24A-24G and 25A-25G are views sequentially illustrating a method for manufacturing a key module provided in an electronic device according to an embodiment of the present invention.

First, referring to FIGS. 1 to 4, 23, and 24, a supporting structure 330 including a hole 334 is prepared (FIG. 24A). A waterproof structure 350 with at least one first portion 351 may be disposed in the supporting structure 330 (step 11, FIG. 24B). Since the waterproof structure 350 is formed of an elastic material, one surface of the waterproof structure 350 may elastically be seated on a surrounding portion of the hole 334 of the supporting structure 330. The other surface of the waterproof structure 350 is disposed so that the first portion 351 where the first surface 315 may be seated and the second portion 353 abutting the main body are seen. The first portion 351 may elastically be stretched or compressed as the first surface 315 of the key 310 is moved, providing a better click feeling when the user presses the key 310. The second portion 353 may form a contact surface 355 while abutting the inside of the main body, blocking a fluid permeating from the outside.

Thereafter, a flexible printed circuit board 390 having a dome button 370 seated thereon may be placed in the receiving space 335 formed inside the supporting structure 330 (step 13, FIG. 24C). The flexible printed circuit board 390 may be disposed abutting the inner surface of the receiving space 335 of the supporting structure 330, and the dome button 370 may be disposed on the flexible printed circuit board 390. The dome button 370 may be formed of an elastic material, receiving pressure applied from the outside to the key 310 from the first surface 315 and transferring the pressure to the printed circuit board 390.

The step of seating the supporting structure 330 where the waterproof structure 350, the dome button 370, and the flexible printed circuit board 390 are arranged in the seating part 23 of the main body may be carried out (step 15, FIG. 24D). The seating part 23 which is shaped as a hole corresponding to the shape of the outer surface of the supporting structure 330 may be configured inside the main body, able to shakelessly support the supporting structure 330 when the supporting structure 330 is seated.

The supporting structure 330 and the main body may be fastened together by a fastening part 336 disposed on a side surface of the supporting structure 330 (step 17, FIG. 24E). The fastening part 336 may be provided in a wing shape outside the receiving space 335 of the supporting structure 330 and include a hole-shaped fastening hole 3361 and a screw 3363 passing through the fastening hole 3361 to fasten the main body with the supporting structure 330. The screw 3363 and the fastening hole 3361 may fasten the main body with the supporting structure 330 via a male-female coupling between the screw 3363 and the fastening hole 3361. According to an embodiment of the present invention, although two fastening holes 3361 and two screws 3363 are configured, they are not limited thereto. Rather, it is apparent that various numbers of fastening holes and screws may be provided in a variety of positions to fasten the supporting structure 330 to the inside of the main body, and such fastening may be achieved in other various manners, e.g., by way of snap-fits, rivets, or bonding, other than screwing.

Thereafter, the key 310 may partially be inserted to the inside of the main body from the outside (step 19, FIG. 24F). According to an embodiment of the present invention, the first surface 315 of the key 310 may be inserted into the first portion 351 of the waterproof structure 350 disposed inside the main body, and the steps of the key 310 may be fastened to side coupling parts 24 formed in the main body bezel 2. The key button part 311 of the key 310 may partially project to the outside of the main body, allowing the user to click thereon with his finger. Here, the steps of the key 310 may be fastened to the main body in a third direction Z different from the first direction X along which the first surface 315 is inserted, preventing the key 310 from escaping off. This also enables pressure to be transferred to the dome button 370 whatever portion of the key button part 311 is pressed.

The key module 300 may be seated precisely in place by the manufacturing method set forth above (FIG. 24G).

FIGS. 23 and 25A-25G are views sequentially illustrating a method for manufacturing a key module 400 provided in an electronic device according to an embodiment of the present invention.

Figure 25A:
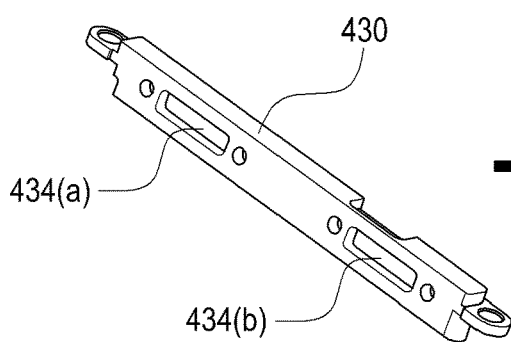
Figure 25B:
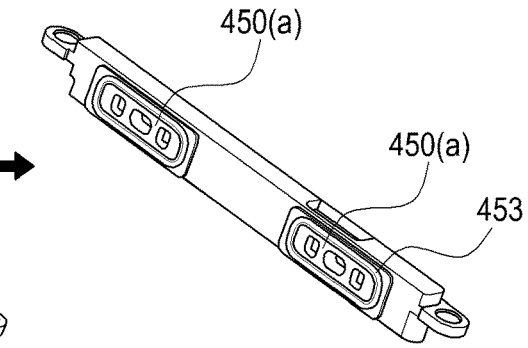

Referring to FIGS. 16, 17, 23, and 25, supporting structures 430 including two holes 434(a) and 434(b) are prepared (FIG. 25A). Two waterproof structures 450(a) and 450(b) with at least one first portion 451 may be disposed in their respective supporting structures 430 (step 11, FIG. 25B). Since the waterproof structures 450 are formed of an elastic material, first surfaces of the waterproof structures 350 may elastically be seated on surrounding portions of the holes 434(a) and 434(b) of the supporting structures 430. The other surfaces of the waterproof structures 450 are disposed so that the first portions 451(a) and 451(b) where the first surfaces 415(a) and 415(b) of the key 410 may be seated and the second portion 453 abutting the main body are seen. The first portion 451 may elastically be stretched or compressed as the first surface 415 of the key 410 is moved, providing a better click feeling when the user presses the key 310. The second portion 453 may form a contact surface 455 while abutting the inside of the main body, blocking a fluid permeating from the outside.

Figure 25C:
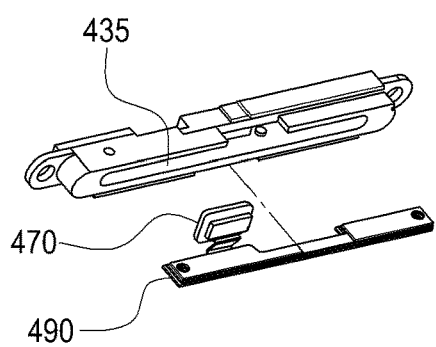

Thereafter, a flexible printed circuit board 490 having a dome button 470 seated thereon may be placed in the receiving space 435 formed inside the supporting structure 430 (step 13, FIG. 25C). The flexible printed circuit board 490 may be disposed abutting the inner surface of the receiving space 435 of the supporting structure 430, and the dome button 470 may be disposed on the flexible printed circuit board 490. The dome button 470 may be formed of an elastic material, receiving pressure applied from the outside to the key 410 from the first surface 415 and transferring the pressure to the printed circuit board 490.

Figure 25D:
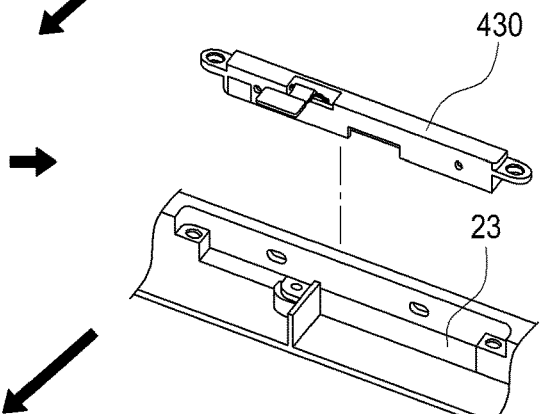

The step of seating the supporting structure 430 where the two waterproof structures 450(a) and 450(b), the dome button 470, and the flexible printed circuit board 490 are arranged in the seating part 23 of the main body may be carried out (step 15, FIG. 25D). The seating part 23 which is shaped as a hole corresponding to the shape of the outer surface of the supporting structure 430 may be configured inside the main body, able to shakelessly support the supporting structure 430 when the supporting structure 330 is seated.

Figure 25E:
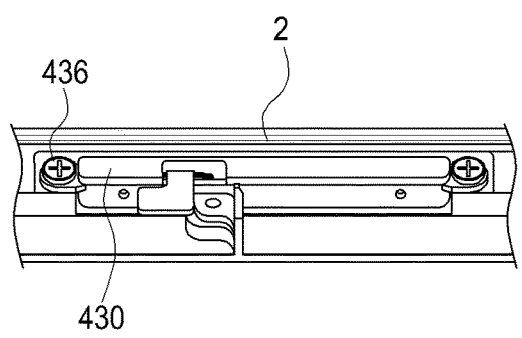

The supporting structure 430 and the main body may be fastened together by a fastening part 430 disposed on a side surface of the supporting structure 436 (step 17, FIG. 25E). The fastening part 436 may be provided in a wing shape outside the receiving space 435 of the supporting structure 430 and include a hole-shaped fastening hole 4361 and a screw 4363 passing through the fastening hole 4361 to fasten the main body with the supporting structure 430. The screw 4363 and the fastening hole 4361 may fasten the main body with the supporting structure 430 via a male-female coupling between the screw 3363 and the fastening hole 3361. According to an embodiment of the present invention, although two fastening holes 4361 and two screws 4363 are configured, they are not limited thereto. Rather, it is apparent that various numbers of fastening holes and screws may be provided in a variety of positions to fasten the supporting structure 430 to the inside of the main body, and such fastening may be achieved in other various manners, e.g., by way of snap-fits, rivets, or bonding, other than screwing.

Figure 25F:
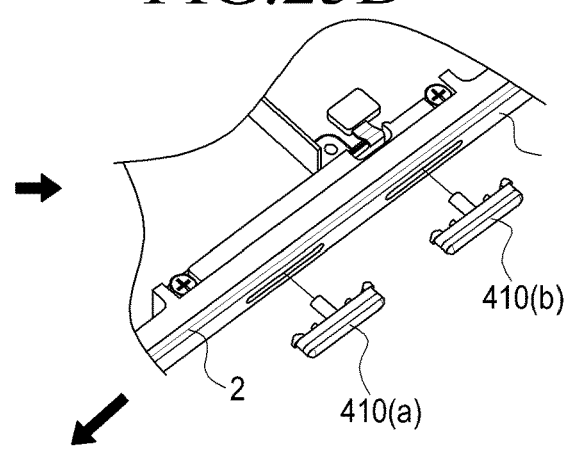

Thereafter, the two keys 410 may partially be inserted to the inside of the main body from the outside (step 19, FIG. 25F). According to an embodiment of the present invention, the first surfaces 415(a) and 415(b) of the keys 410(a) and 410(b) may be inserted into the first portions 451(a) and 451(b) of the waterproof structures 450(a) and 450(b) disposed inside the main body, and the steps of the keys 410 may be fastened to side coupling parts 24 formed in the main body bezel 2. The key button part 411 of the key 410 may partially project to the outside of the main body, allowing the user to click thereon with his finger. Here, the steps of the key 410 may be fastened to the main body in a third direction Z different from the first direction X along which the first surface 415 is inserted, preventing the key 410 from escaping off. This also enables pressure to be transferred to the dome button 470 whatever portion of the key button part 411 is pressed.

Figure 25G:
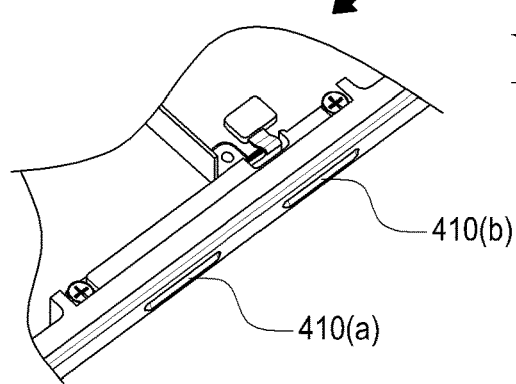

The key module 400 may be seated precisely in place by the manufacturing method set forth above (FIG. 25G).

Now described is a method for manufacturing a key module according to an embodiment of the present invention.

Figure 26:
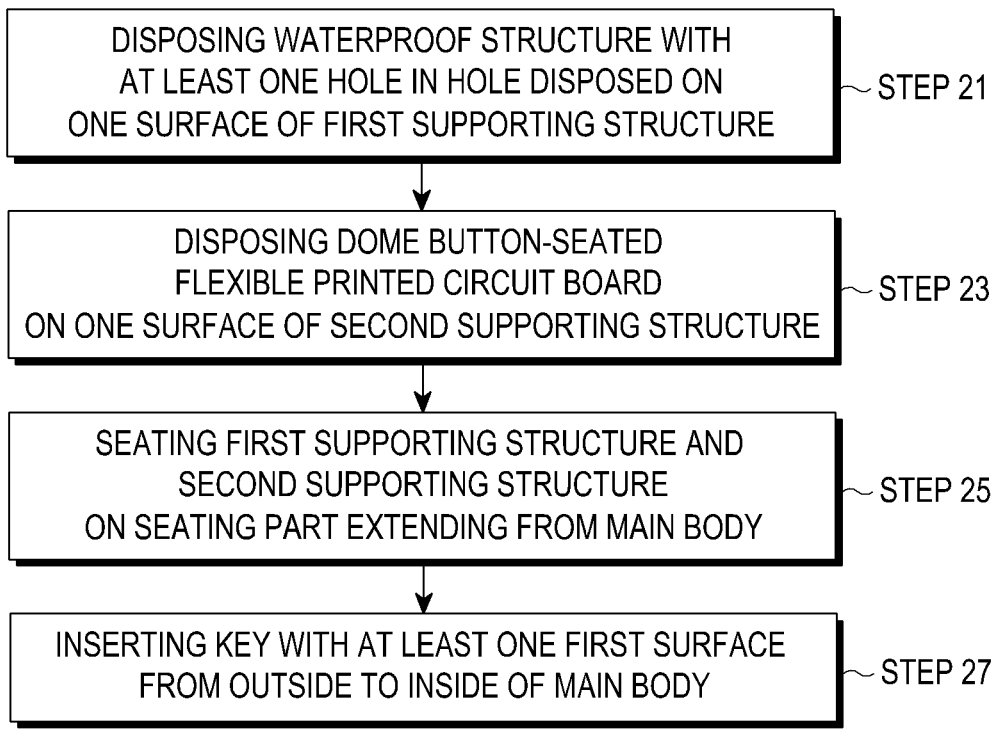
FIG. 26 is a flowchart illustrating a method for manufacturing a key module provided in an electronic device according to an embodiment of the present invention.

FIG. 26 is a flowchart illustrating a method for manufacturing a key module provided in an electronic device according to an embodiment of the present invention.

FIGS. 27A-27H and 28A-28G are views illustrating a method for manufacturing a key module provided in an electronic device according to an embodiment of the present invention.

Figure 27A:
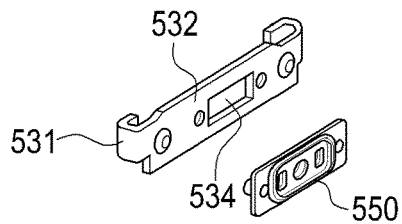
Figure 27B:
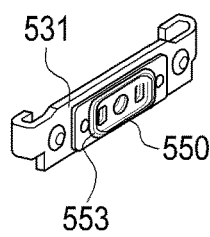

Referring to FIGS. 26 and 27A-27H, a first supporting structure 531 including at least one hole 534 is prepared (FIG. 27A). A waterproof structure 550 with at least one first portion 551 may be disposed in the first supporting structure 531 (step 21, FIG. 27B). For example, the waterproof structure 550 may be formed of an elastic material. A second portion 553 corresponding to one surface of the waterproof structure 550 may elastically be seated in a first supporting surface 532 including a hole 534 of the first supporting structure 531. The other surface of the waterproof structure 550 may include the first portion 551 where the first surface 515 of the key 510 may be seated and the second portion 553 abutting the main body.

The first portion 551 of the waterproof structure 550 may elastically be stretched or compressed as the first surface 515 of the key 510 is moved, providing a better click feeling when the user presses the key 510. The second portion 553 may form a contact surface while abutting the inside of the main body, blocking a fluid permeating from the outside.

Figure 27C:
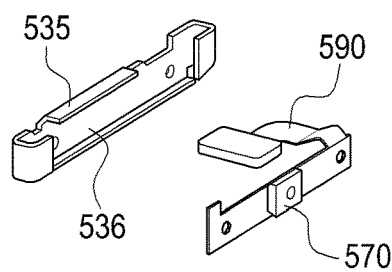
Figure 27D:
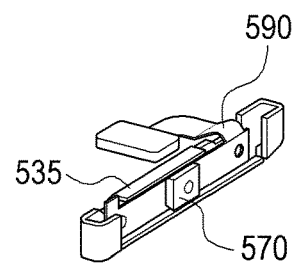

As a next step, a second supporting structure 535 and a flexible printed circuit board 590 where a dome button 570 is seated are prepared (FIG. 27C). A step for placing the dome button (570)-seated flexible printed circuit board 590 on one surface of the second supporting structure 535 may be performed (step 23, FIG. 27D). The flexible printed circuit board 590 may be disposed to abut a second supporting surface 536 which is an inner surface of the second supporting structure 535, and the dome button 570 may be disposed on the flexible printed circuit board 590. The dome button 570 may be formed of an elastic material, receiving pressure applied from the outside to the key 510 from the first surface 515 and transferring the pressure to the printed circuit board 590.

Figure 27E:
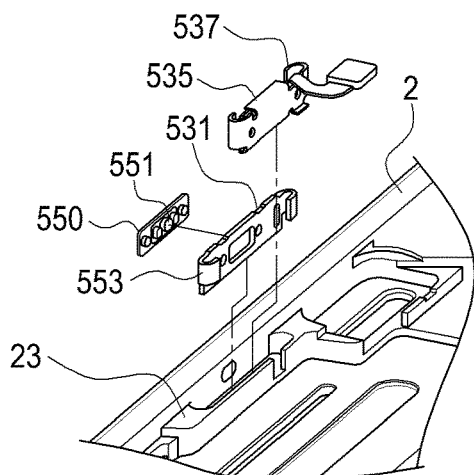
Figure 27F:
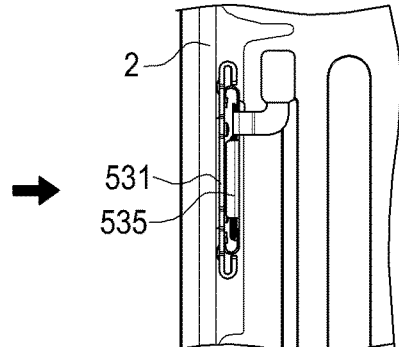

The step of seating the first supporting structure 531 where the waterproof structure 550 is disposed and the second supporting structure 530 where the dome button 570 and the flexible printed circuit board 590 are arranged in the seating part 23 of the main body may be carried out (step 25, FIG. 27E). The seating part 23 which is shaped as a hole corresponding to the shape of the outer surface of the first supporting structure 531 and the second supporting structure 535 may be configured inside the main body, able to shakelessly support the supporting structures 530 when the supporting structures 530 are seated (FIG. 27F).

According to an embodiment of the present invention, a first protrusion 533 corresponding in shape to the edge of the seating part 23 may be provided at an outside of the first supporting structure 531 to prevent the second supporting structure 535 from escaping off while allowing it to be fastened and seated in the seating part 23.

The first protrusion 533 may be disposed at each of both edges of the first supporting structure 531 and may be provided in a curved shape bent inwards. The first protrusions 533 may be formed with an interval therebetween to allow the second supporting structure 535 to be disposed in the space inside the first protrusions 533.

According to an embodiment of the present invention, an adhesive material (not shown) may be disposed between the first supporting structure 531 and the waterproof structure 550. The adhesive material may reinforce the coupling between the first supporting structure 531 and the waterproof structure 550 and enhance waterproof capability. The adhesive material may include various materials, e.g., an acrylic-based chemical-containing tape or a diversity of adhesives, or other various materials capable of attaching the waterproof structure 550 or first supporting structure 531.

According to an embodiment of the present invention, after the first supporting structure 531 is vertically disposed at a side of the seating part 23, the second supporting structure 535 may be disposed at the opposite side of the seating part 23 to face the first supporting structure 531. For example, the first supporting structure 531 and the second supporting structure 535 may be disposed opposite and parallel with each other at the edge of the seating part 23 with an elliptical hole.

Where the first supporting structure 531 is seated on the seating part 23, a predetermined gap from the seating part 23 may be produced, allowing the waterproof structure 550 to be disposed without being pushed and allowing the second supporting structure 535 to be seated while pushing the first supporting structure 531 to the outside of the main body, thereby providing a waterproof contacting surface needed to be sealed off.

The second supporting structure 535 may include a second supporting surface 536 apart in parallel with the first supporting structure 531, and the second supporting surface 536 may allow various parts to be mounted and supported. The flexible printed circuit board 590 may be disposed in contact with the second supporting surface 536, and the dome switch 570 may be disposed in contact with the printed circuit board 590 to transfer pressure coming from the key.

According to an embodiment of the present invention, the second protrusions 537 may be disposed at both side edges of the second supporting structure 535 and provided in curved shapes bent inwards. The second protrusions 537 may be disposed at the center of the second supporting structure 535 and provided in curved shapes bent inwardly.

The second protrusions 537 may be disposed in tight contact with the first supporting structure 531, providing a force to push the first supporting structure 531 outwards (in the direction where the key 510 is disposed or towards the bezel 2). The pushing force may push the first supporting structure 531 to the side surface of the seating part 23 and compress the waterproof structure 550 disposed between the bezel 2 and the first supporting structure 531. The compressed waterproof structure 550 may reinforce the effect of preventing permeation of a fluid from the outside.

Figure 27G:
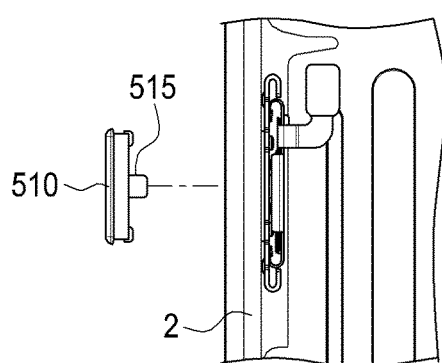

After the first supporting structure 531 and the second supporting structure 535 are combined and seated in the seating part 23, the key 510 may partially be inserted from the outside ton the inside of the main body (step 27, FIG. 27G).

According to an embodiment of the present invention, the first surface 515 of the key 510 may be inserted into the first portion 551 of the waterproof structure 550 disposed inside the main body, and the steps of the key 510 may be fastened to side coupling parts formed in the main body bezel 2. The key button part 611 of the key 510 may partially project to the outside of the main body, allowing the user to click thereon with his finger. Here, the steps of the key 510 may be fastened to the main body in a third direction Z different from the first direction X along which the first surface 515 is inserted, preventing the key 510 from escaping off. This also enables pressure to be transferred to the dome button 570 whatever portion of the key button part 511 is pressed.

Figure 27H:
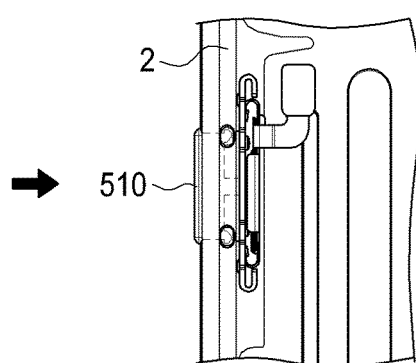

The key module 500 may be seated precisely in place by the manufacturing method set forth above (FIG. 27H).

FIGS. 26 and 28A-28G are views illustrating in order a method for manufacturing a key module provided in an electronic device according to an embodiment of the present invention.

Referring to FIGS. 26 and 28A-28G, a first supporting structure 631 including two holes 634(a) and 634(b) are prepared (FIG. 28A). Two waterproof structures 650(a) and 650(b) with at least one first portion 651 may be disposed in the first supporting structure 631 (step 21, FIG. 28B). Since the waterproof structures 650 are formed of an elastic material, first surfaces of the waterproof structures 650 may elastically be seated on the first supporting surfaces 632 including the holes 634 of the first supporting structure 631. The other surfaces of the waterproof structures 650 are disposed so that the first portions 651(a) and 451(b) where the first surfaces 615(a) and 415(b) of the key 610 may be seated and the second portion 653 abutting the main body are seen. The first portion 651 may elastically be stretched or compressed as the first surface 615 of the key 610 is moved, providing a better click feeling when the user presses the key 610. The second portion 653 may form a contact surface while abutting the inside of the main body, blocking a fluid permeating from the outside.

As a next step, a second supporting structure 635 and a flexible printed circuit board 690 where two dome buttons 670 are seated are prepared (FIG. 28C). A flexible printed circuit board 690 where the two dome buttons 670 are seated may be placed on the second surface 636 of the second supporting structure 635 (step 23, FIG. 28D). The flexible printed circuit board 690 may be disposed to abut a second supporting surface 636 of the second supporting structure 635, and the dome button 670 may be disposed on the flexible printed circuit board 690. The dome button 670 may be formed of an elastic material, receiving pressure applied from the outside to the key 610 from the first surface 615 and transferring the pressure to the printed circuit board 690.

The step of seating the first supporting structure 631 where the two waterproof structures 650(a) and 650(b) are disposed and the second supporting structure 635 where the two dome buttons 670 and the flexible printed circuit board 690 are arranged in the seating part 23 of the main body may be carried out (step 25, FIG. 28E). The seating part 23 which is shaped as a hole corresponding to the shape of the outer surface of the supporting structure 630 may be configured inside the main body, able to shakelessly support the supporting structures 630 when the supporting structures 530 are seated.

According to an embodiment of the present invention, after the first supporting structure 631 is vertically disposed at a side of the seating part 23, the second supporting structure 635 may be disposed at the opposite side of the seating part 23 to face the first supporting structure 631. For example, the first supporting structure 631 and the second supporting structure 635 may be disposed opposite and parallel with each other at the edge of the seating part 23 with an elliptical hole.

Where the first supporting structure 631 is seated on the seating part 23, a predetermined gap from the seating part 23 may be produced, allowing the waterproof structure 650 to be disposed without being pushed and allowing the second supporting structure 635 to be seated while pushing the first supporting structure 631 to the outside of the main body, thereby providing a waterproof contacting surface needed to be sealed off.

According to an embodiment of the present invention, the second protrusions 637 may be disposed at both side edges of the second supporting structure 635 and provided in curved shapes bent inwards. The second protrusions 637 may be disposed at the center of the second supporting structure 635 and provided in curved shapes bent inwardly.

The second protrusions 637 may be disposed in tight contact with the first supporting structure 631, providing a force to push the first supporting structure 631 outwards (in the direction where the key 610 is disposed or towards the bezel 2). The pushing force may push the first supporting structure 631 to the side surface of the seating part 23 and compress the waterproof structure 650 disposed between the bezel 2 and the first supporting structure 631. The compressed waterproof structure 650 may reinforce the effect of preventing permeation of a fluid from the outside.

After the first supporting structure 531 and the second supporting structure 535 are combined and seated in the seating part 23, the two keys 610(a) and 610(b) may partially be inserted from the outside ton the inside of the main body (step 27, FIG. 28F).

According to an embodiment of the present invention, the respective first surfaces 615(a) and 615(b) of the keys 610(a) and 610(b) may be inserted into the first portions 651(a) and 651(b) of the waterproof structures 650(a) and 650(b) disposed inside the main body, and the steps of the keys 610 may be fastened to side coupling parts formed in the main body bezel 2. The key button part 611 of the key 610 may partially project to the outside of the main body, allowing the user to click thereon with his finger. Here, the steps of the key 610 may be fastened to the main body in a third direction Z different from the first direction X along which the first surface 615 is inserted, preventing the key 610 from escaping off. This also enables pressure to be transferred to the dome button 670 whatever portion of the key button part 611 is pressed.

The key module 600 may be seated precisely in place by the manufacturing method set forth above (FIG. 28G).

It is apparent to one of ordinary skill in the art that the key modules according to various embodiments of the present invention as described above are not limited to the above-described embodiments and those shown in the drawings, and various changes, modifications, or alterations may be made thereto without departing from the scope of the present invention.

What is claimed is:

1. A portable electronic device, comprising:
a glass front over forming a front surface of the electronic device;
a rear cover forming a rear surface of the electronic device;
a bezel surrounding a space formed between the front cover and the rear cover and including a portion having a first opening to the space;
a display device contained in the space and including a view area viewable through the front cover;
a seat including a flat surface positioned parallel to the front cover;
a pressable key disposed in the first opening;
a supporting structure seated in the seat and including a second opening into which a portion of the key extends;
a dome button mounted in the supporting structure and disposed for actuation by the key portion when the key is presssed; and
a waterproof structure including a flexible material,
wherein the waterproof structure includes a first portion disposed between the key portion and the dome button and a second portion disposed between the supporting structure and the bezel.

2. The portable electronic device of claim 1, wherein the first portion of the waterproof structure elastically surrounds a surface of the key portion for actuating the dome button.

3. The portable electronic device of claim 1, wherein the dome button elastically transforms when the key is pressed.

4. The portable electronic device of claim 1, further comprising a flexible printed circuit board disposed adjacent the dome button and configured to generate an electrical signal corresponding to pressure applied as the dome button transforms.

5. The portable electronic device of claim 1, wherein the key includes at least one step for retaining the key in the first opening.

6. The portable electronic device of claim 1, wherein an outer surface of the front cover has a curved surface with a convex surface outwards, and wherein part of, at least, the key and the supporting structure is disposed inside the curved surface with the convex surface.

7. The portable electronic device of claim 1, wherein the supporting structure includes a first face and a second face spaced apart from the first face, the waterproof structure is seated on the first face, and the dome button and a flexible printed circuit connected to dome button are provide in the space between the first face and the second face.

8. The portable electronic device of claim 1, wherein the supporting structure includes a first supporting structure and second supporting structure having a surface parallel to the first supporting structure, the first supporting structure including a third opening for seating the waterproof structure and the second supporting structure including at least one protrusion disposed towards the bezel and facing the first supporting structure.

9. The portable electronic device of claim 8, wherein the seat is configured to seat the first supporting structure and the second supporting structure.

10. The portable electronic device of claim 5, wherein the at least one step includes a first step and a second step spaced apart from each other on opposite sides of the key portion.

11. The portable electronic device of claim 1, wherein the bezel is formed integrally with the rear cover.

12. The portable electronic device of claim 1, wherein the bezel is formed separately from the rear cover.

* * * * *